United States Patent
Yakushiji et al.

(10) Patent No.: US 11,289,305 B2
(45) Date of Patent: Mar. 29, 2022

(54) DEPOSITION METHOD AND DEPOSITION APPARATUS

(71) Applicant: Canon Anelva Corporation, Kawasaki (JP)

(72) Inventors: Hiroshi Yakushiji, Tokyo (JP); Yuzuru Miura, Tama (JP); Masahiro Shibamoto, Hachioji (JP)

(73) Assignee: CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 16/946,476

(22) Filed: Jun. 24, 2020

(65) Prior Publication Data

US 2020/0328062 A1 Oct. 15, 2020

Related U.S. Application Data

(63) Continuation of application No. PCT/JP2017/046910, filed on Dec. 27, 2017.

(51) Int. Cl.
*H01J 37/32* (2006.01)
*C23C 14/32* (2006.01)
(Continued)

(52) U.S. Cl.
CPC ...... *H01J 37/32055* (2013.01); *C23C 14/325* (2013.01); *C23C 14/505* (2013.01); *C23C 14/54* (2013.01); *H01J 37/3417* (2013.01)

(58) Field of Classification Search
CPC .. H01J 37/32055; H01J 37/3417; H01J 27/08; H01J 37/32614; C23C 14/325;
(Continued)

(56) References Cited

U.S. PATENT DOCUMENTS

| 5,269,896 | A | * | 12/1993 | Munemasa | ....... | H01J 37/32055 204/192.38 |
| 6,262,539 | B1 | * | 7/2001 | Shi | ................... | H01J 37/32055 204/192.38 |

(Continued)

FOREIGN PATENT DOCUMENTS

| CN | 102953035 A | 3/2013 |
| CN | 105102669 A | 11/2015 |

(Continued)

OTHER PUBLICATIONS

International Search Report (PCT/ISA/210) and translation and Written Opinion (PCT/ISA/237) dated Mar. 6, 2018, by the Japanese Patent Office as the International Searching Authority for International Application No. PCT/JP2017/046910.

(Continued)

*Primary Examiner* — Jennifer Wecker
*Assistant Examiner* — Patrick S Ott
(74) *Attorney, Agent, or Firm* — Buchanan Ingersoll & Rooney PC

(57) ABSTRACT

A deposition method of arranging a discharge portion of a striker near a target to induce arc discharge and forming a film on a substrate using a plasma generated by the arc discharge is disclosed. The method includes a changing step of changing a position for inducing the arc discharge by the striker in a region set in the target, a deposition step of forming the film on the substrate using the plasma generated by inducing the arc discharge at the position, and a reduction step of reducing the region in accordance with use of the target.

12 Claims, 26 Drawing Sheets

(51) Int. Cl.
  *C23C 14/54* (2006.01)
  *H01J 37/34* (2006.01)
  *C23C 14/50* (2006.01)

(58) Field of Classification Search
  CPC ..... C23C 14/505; C23C 14/54; C23C 14/543;
      H05B 31/28; H05B 31/30; H05B
      31/0078; H05B 31/305; H05H 1/50
  USPC ...................................... 204/298.41; 427/580
  See application file for complete search history.

(56) References Cited

U.S. PATENT DOCUMENTS

| | | | |
|---|---|---|---|
| 10,676,813 B2 | 6/2020 | Atsumi | |
| 2004/0055884 A1* | 3/2004 | Fujii | C23C 14/325 |
| | | | 204/298.41 |
| 2009/0065348 A1 | 3/2009 | Fujii | |
| 2011/0109227 A1 | 5/2011 | Shiina | |
| 2012/0186521 A1 | 7/2012 | Iwasaki et al. | |
| 2016/0071702 A1 | 3/2016 | Suzuki et al. | |
| 2016/0326630 A1* | 11/2016 | Atsumi | H01J 37/3417 |
| 2018/0016674 A1 | 1/2018 | Masuno et al. | |

FOREIGN PATENT DOCUMENTS

| | | | |
|---|---|---|---|
| CN | 106715750 A | 5/2017 |
| JP | 2004060019 A | 2/2004 |
| JP | 2007254802 A | 10/2007 |
| JP | 2009242929 A | 10/2009 |
| KR | 1020160132969 A | 11/2016 |
| KR | 1020170106321 A | 9/2017 |
| TW | 201612346 A | 4/2016 |
| WO | 9626531 A2 | 8/1996 |
| WO | 2013099059 A1 | 7/2013 |
| WO | 2015140858 A1 | 9/2015 |

OTHER PUBLICATIONS

Office Action dated Jan. 21, 2020, by the Taiwanese Patent Office for Application No. 107145567.

Notification of the First Office Action issued in corresponding Chinese Patent Application No. 201780097973.3, dated Nov. 24, 2021, with English Translation (24 pages).

Grant of Patent issued in corresponding Korean Patent Application No. 10-2020-7017802, dated Feb. 4, 2022, with English Translation (4 pages).

* cited by examiner

UNUSED TARGET

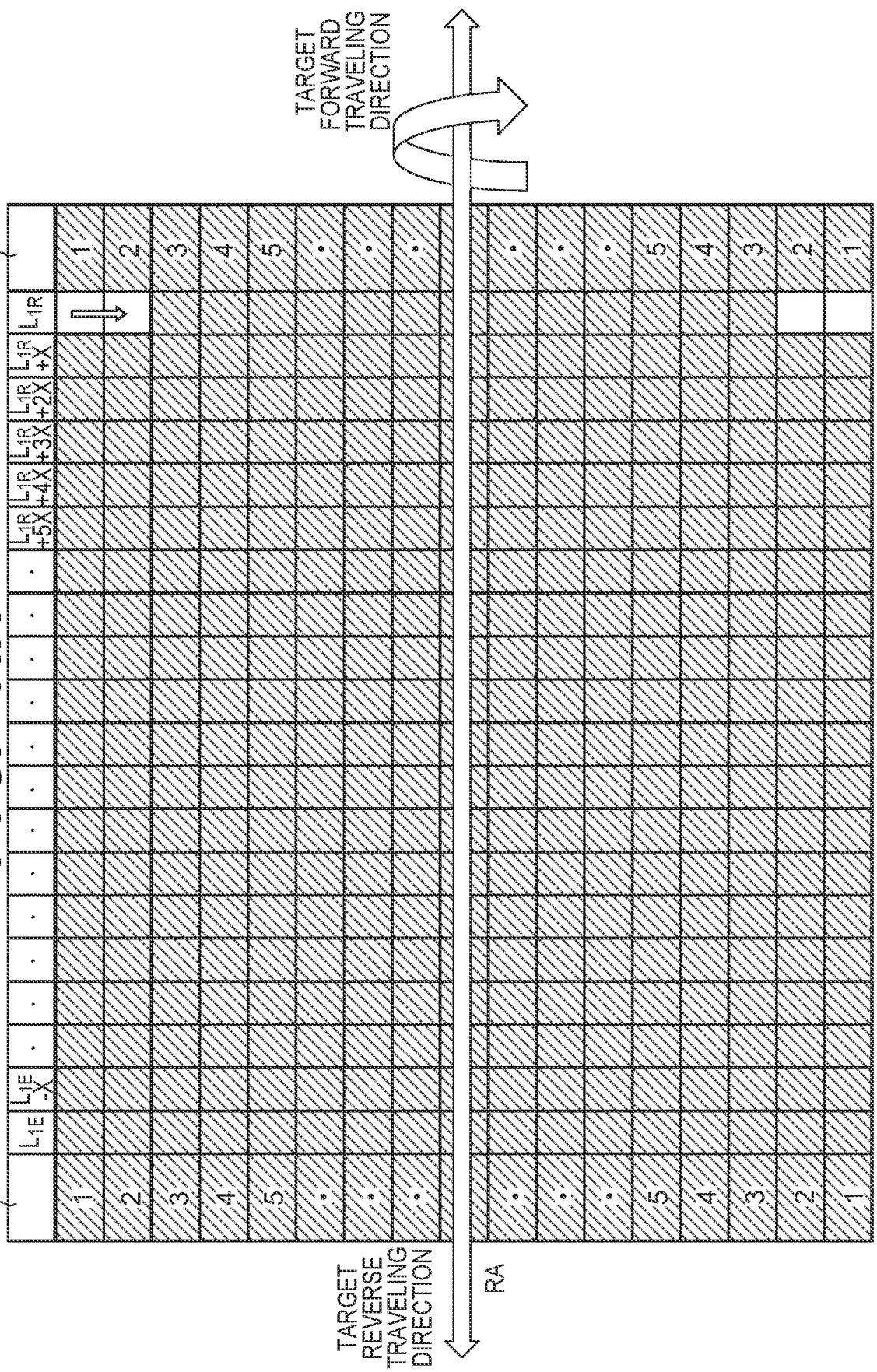

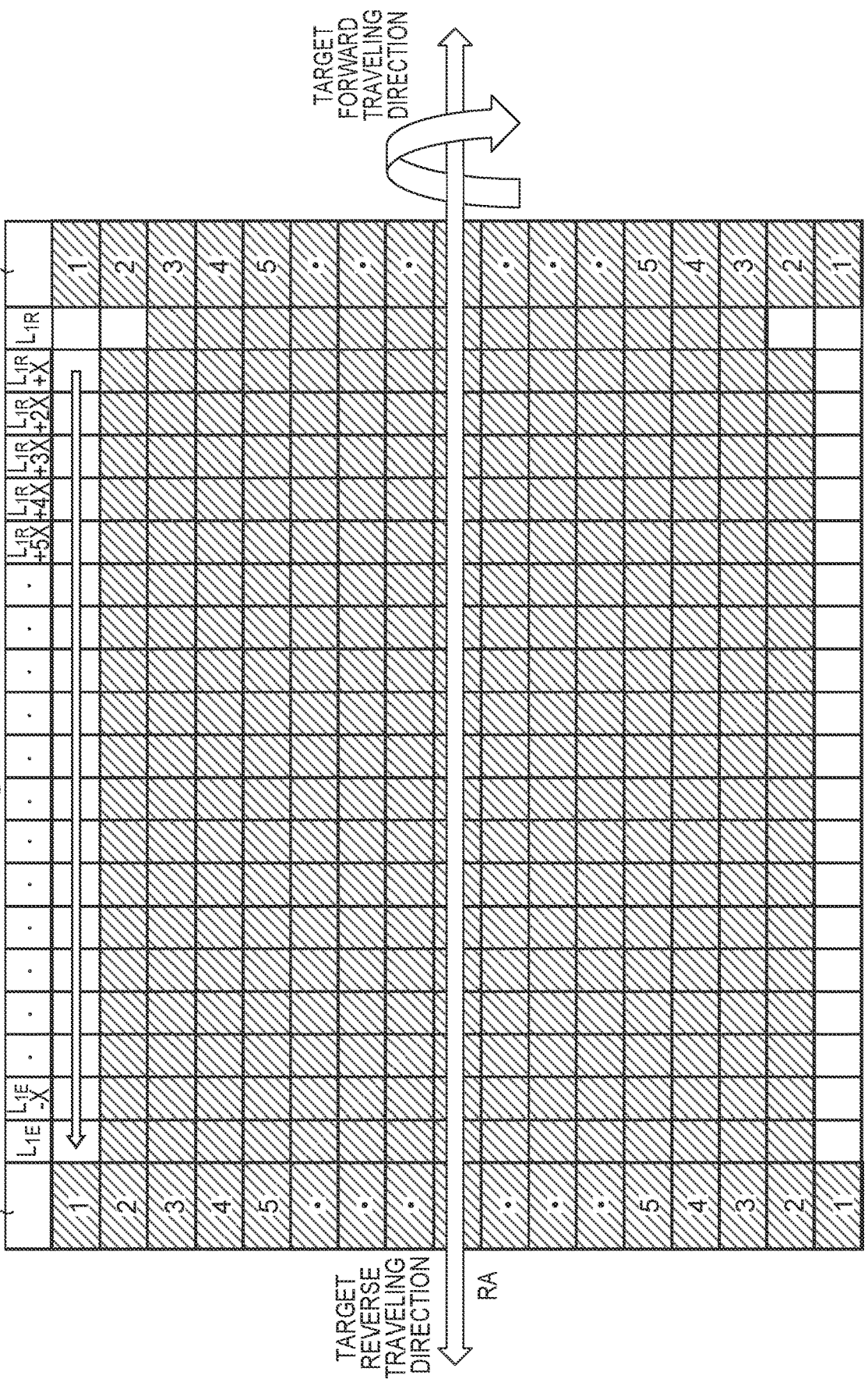

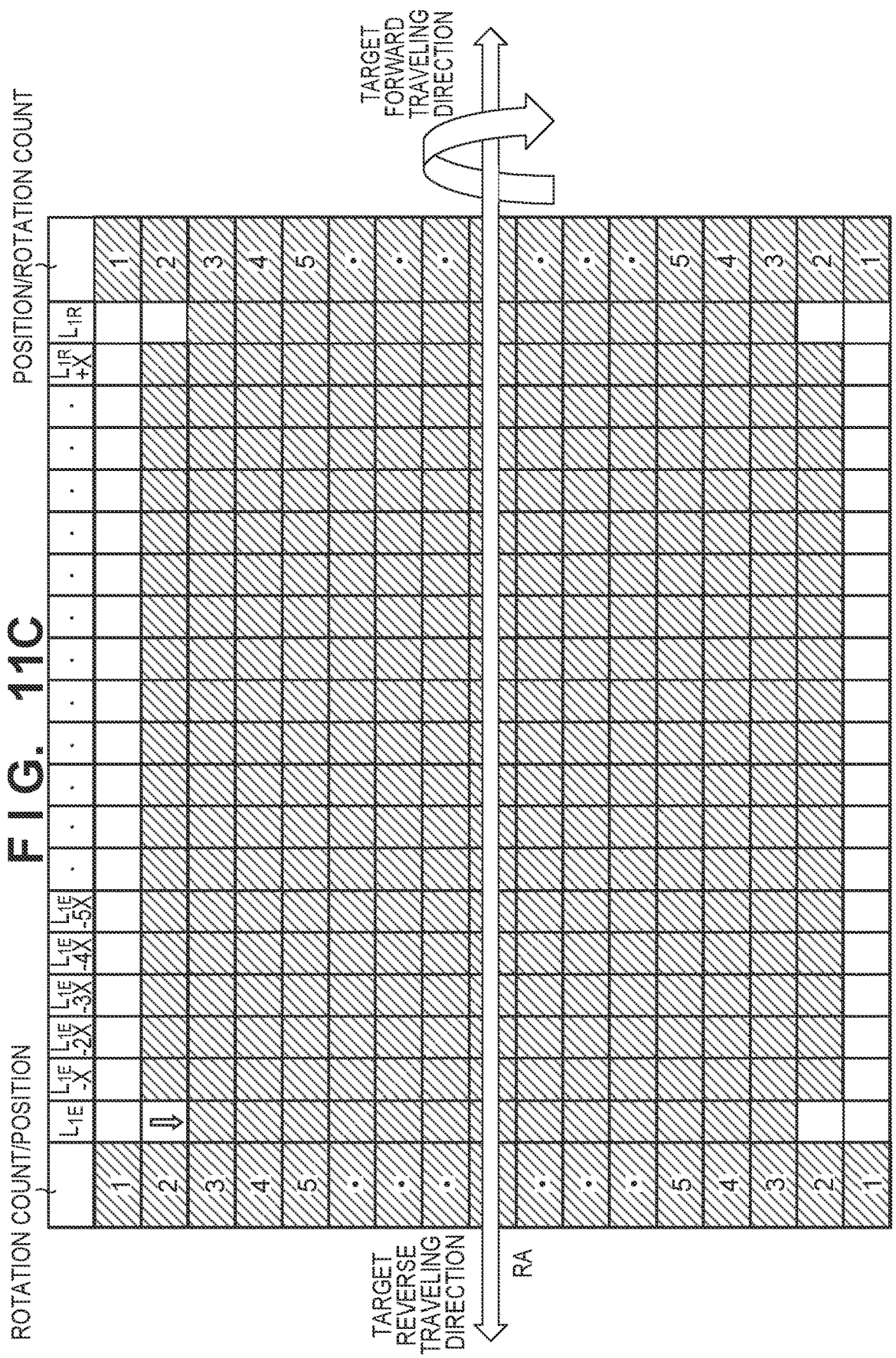

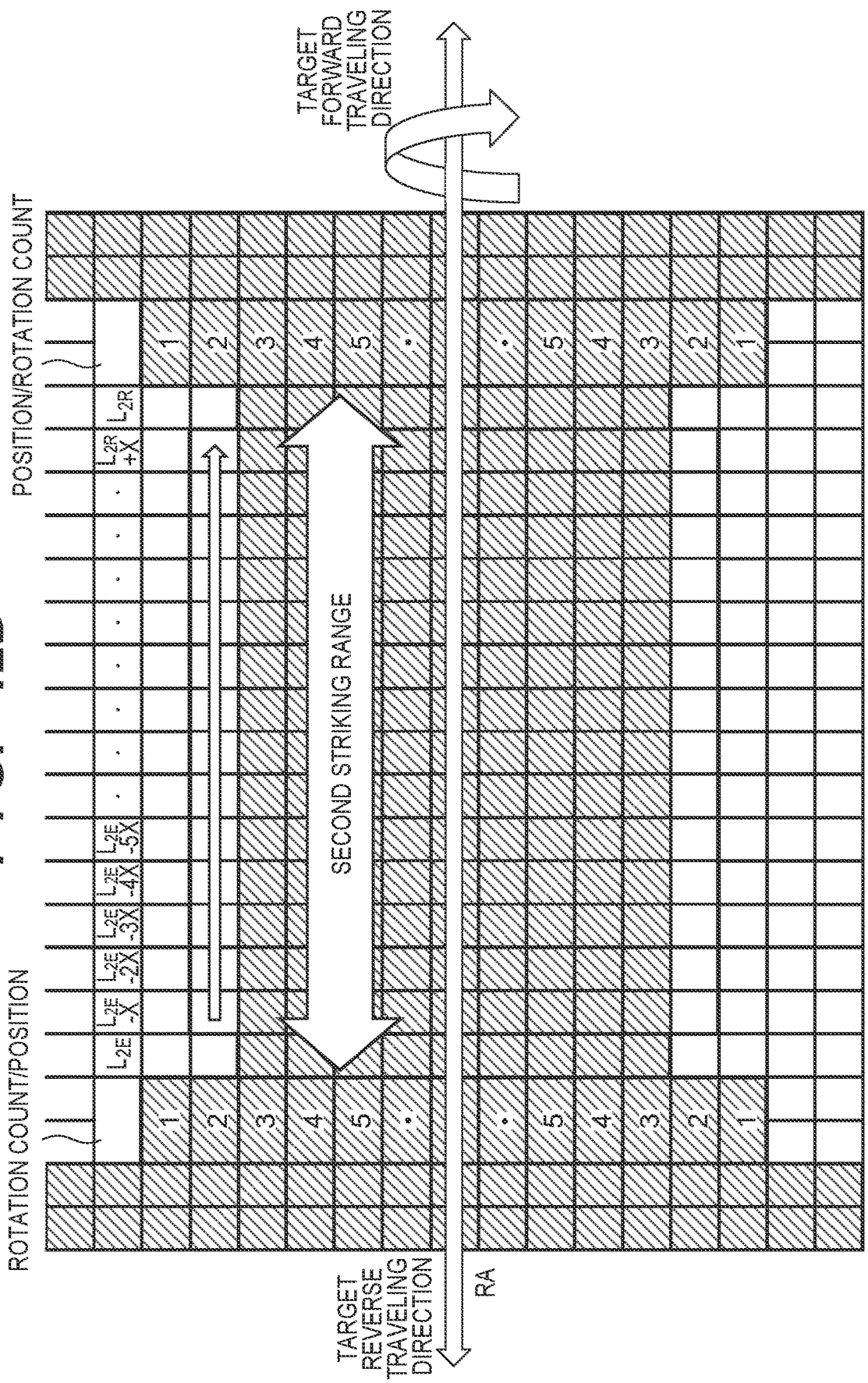

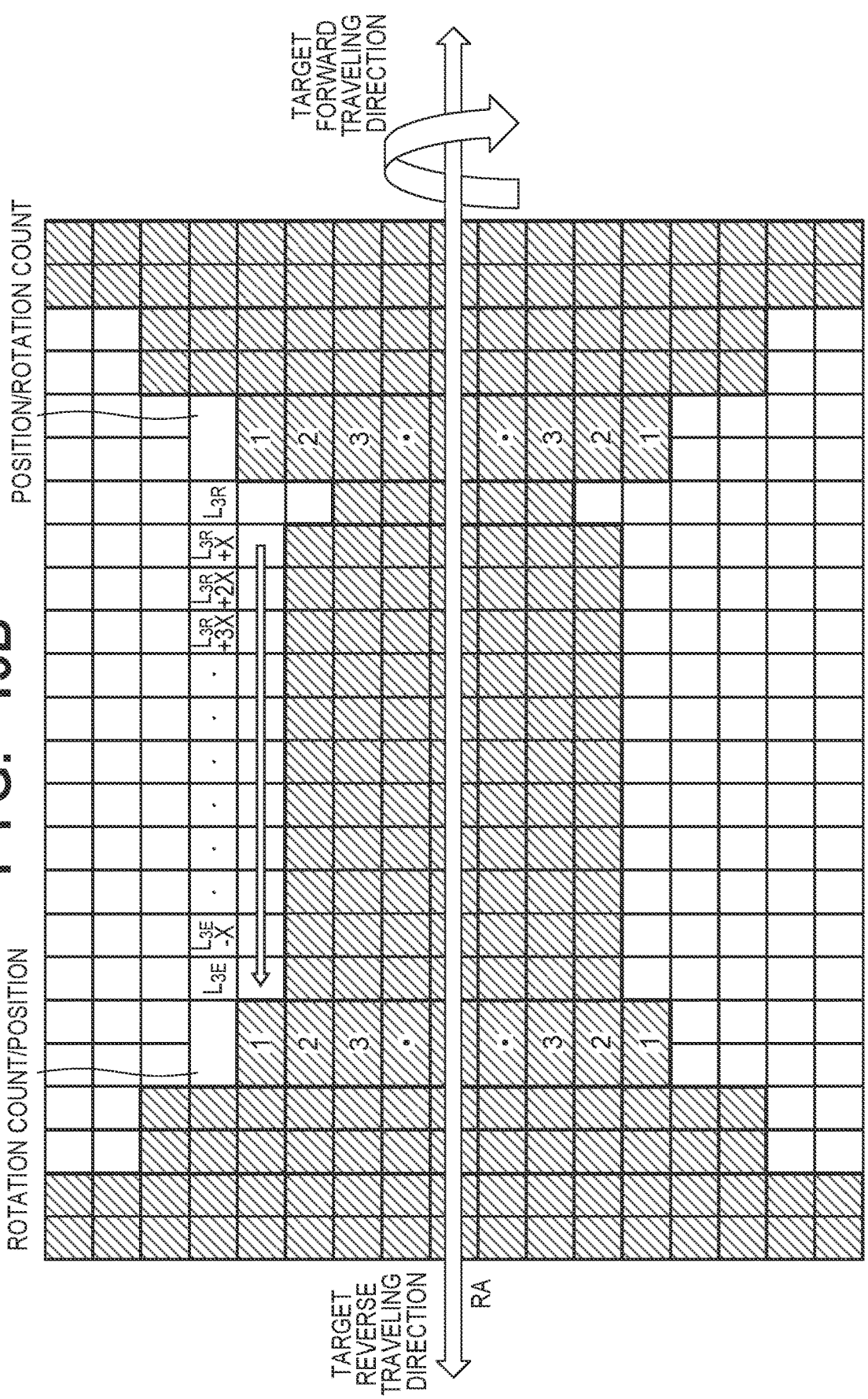

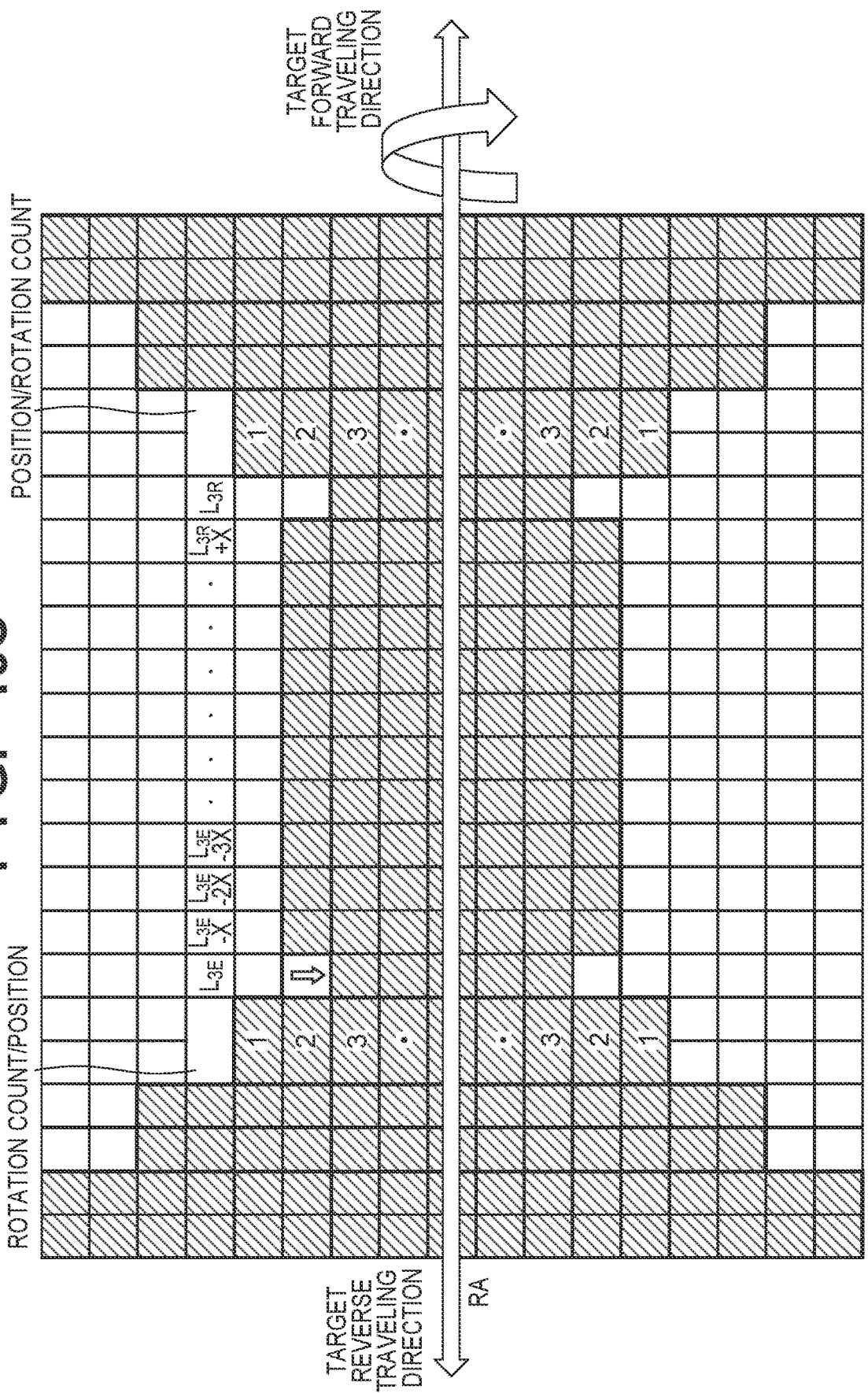

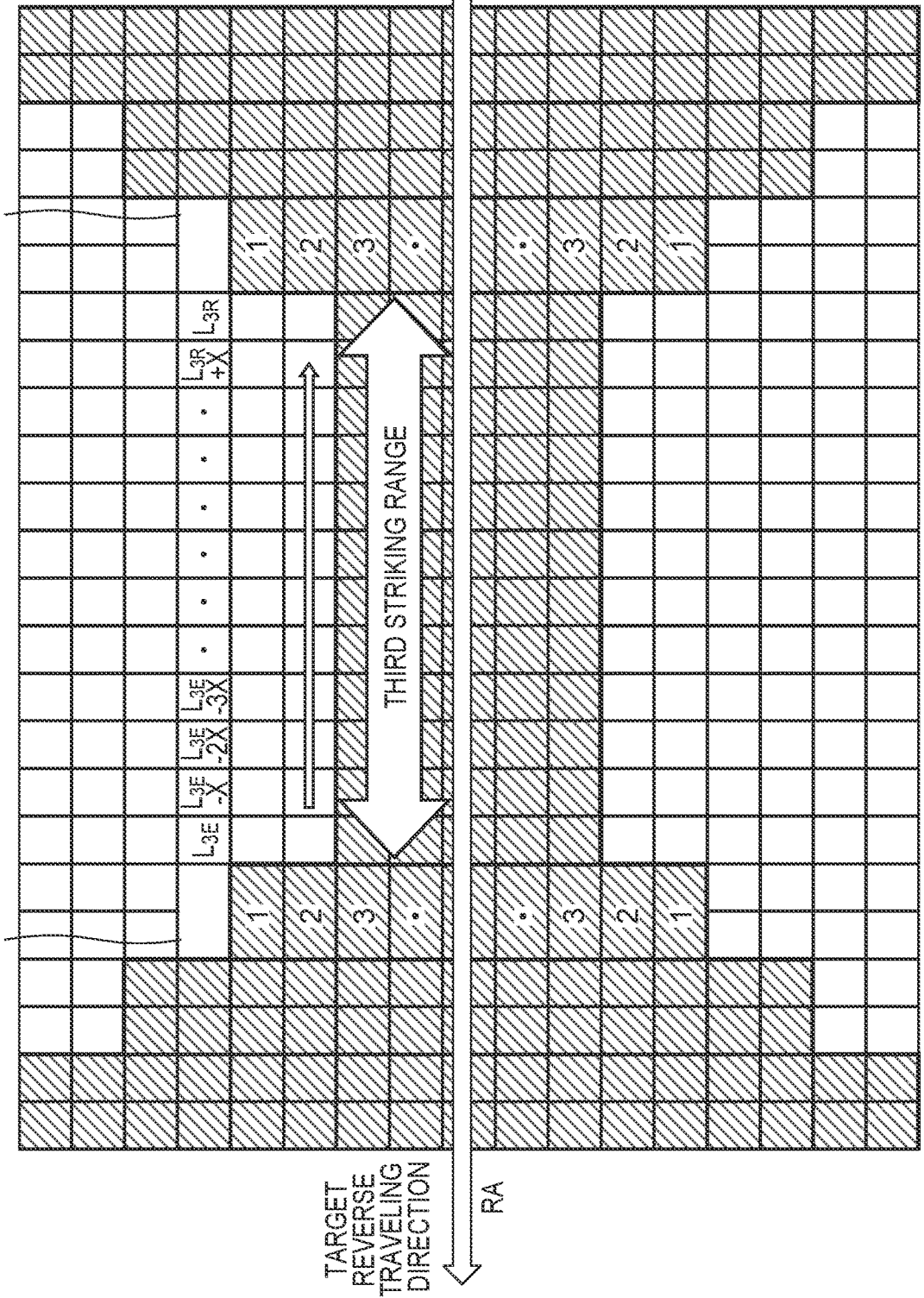

DEPOSITION METHOD AND DEPOSITION APPARATUS

CROSS-REFERENCE TO RELATED APPLICATION(S)

This application is a continuation of International Patent Application No. PCT/JP2017/046910 filed on Dec. 27, 2017, the entire disclosures of which is incorporated herein by reference.

TECHNICAL FIELD

The present invention relates to a deposition method and a deposition apparatus.

BACKGROUND ART

There is available a deposition apparatus that transports a plasma generated by a plasma generation unit to a processing chamber and forms a film on a substrate by the plasma in the processing chamber. As an example of the deposition apparatus, there is enumerated a vacuum arc deposition apparatus for transporting, to a processing chamber, a plasma generated by vacuum arc discharge between a cathode target and an anode in a plasma generation unit, and forming a film on a substrate in the processing chamber. The vacuum arc deposition apparatus is useful to form, for example, a ta-C (tetrahedral amorphous Carbon) film as the surface protective film of a magnetic recording medium of a hard disk drive. In addition, the vacuum arc deposition apparatus is useful to form a hard film containing a metal element such as Ti or Cr on the surface of a machine part, a cutting tool, or the like.

In the vacuum arc deposition methods disclosed in PTLs 1 and 2, a film is formed by inducing the arc discharge between the target and the anode arranged near the target by using the target as the cathode. The arc discharge is induced by bringing the striker connected to the anode portion close to or into contact with the target.

In such a vacuum arc deposition method, in general, the discharge portion (the distal end portion) of the striker is placed near the central portion of the upper surface of a columnar target. An arc spot is formed at a position (that is, the position where the arc discharge has been generated) where the striker on the upper surface of the target comes close or is bright into contact. The target is eroded at the arc spot to form a recess. When the upper surface of the target is locally eroded to form a deep recess, the arc discharge becomes unstable. As a result, the deposition rate is reduced or the arc discharge is extinguished. To cope with this, PTL 2 proposes a deposition apparatus in which the upper surface of the target is trimmed by a grinder or the like to make the upper surface flat if the recess in the upper surface of the target is increased to some extent.

However, when the upper surface of the target is trimmed, a portion available as the target being removed lowers the use efficiency of the target. In addition, in each of the techniques in PTLs 1 and 2, since the step of trimming the upper surface of the target must be inserted between deposition steps, the productivity lowers. In addition, chips of the target may enter into the driving unit of a rotating device for rotating the target. This may make it possible to cause the trouble of the rotating device. To solve this problem, PTL 3 describes a deposition apparatus capable of performing continuous deposition without trimming the target by a grinder or the like. More specifically, PTL 3 describes an arrangement in which a striker is brought close to or into contact with the side surface of a rotation axis of the columnar target, and the target is pivoted so that the position of (the distal end portion of) the striker which opposes the side surface of the target can be changed.

CITATION LIST

Patent Literatures

PTL 1: International Publication No. 96/26531
PTL 2: Japanese Patent Laid-Open No. 2009-242929
PTL 3: International Publication No. 2015/140858

SUMMARY OF INVENTION

Technical Problem

When an arc spot is formed at the end portion of the target, the position of the arc spot may not be stabilized, the deposition rate may become nonuniform, and the arc discharge may be extinguished. To prevent this, an arc spot can be formed at a portion except the end portion of the target. However, if the target is used so that the arc spot is formed at the portion except the end portion of the target, a large step can be formed between the end portion and the portion except the end portion. In this step, as in the end portion, the position of the arc spot cannot be stabilized, the deposition rate can become nonuniform, and the arc discharge can be extinguished.

The present invention has been made in response to the recognition of the above problem and has as its object to provide a technique advantageous in more effectively using the target.

Solution to Problem

The first aspect of the present invention relates to a deposition method of arranging a discharge portion of a striker near a target to induce arc discharge and forming a film on a substrate using a plasma generated by the arc discharge. This deposition method includes a changing step of changing a position for inducing the arc discharge by the striker in a region set in the target, a deposition step of forming the film on the substrate using the plasma generated by inducing the arc discharge at the position, and a reduction step of reducing the region in accordance with use of the target.

The second aspect of the present invention relates to a deposition apparatus for arranging a discharge portion of a striker near a target to induce arc discharge and forming a film on a substrate using a plasma generated by the arc discharge. This deposition apparatus comprises a changing mechanism configured to change a position for inducing the arc discharge by the striker, and a control unit configured to control the changing mechanism so that the position is changed in a region where the target is set, wherein the control unit reduces the region stepwise in accordance with use of the target.

Advantageous Effects of Invention

According to the present invention, there is provided a technique advantageous in more effectively using the target.

BRIEF DESCRIPTION OF DRAWINGS

FIGS. 11A to 11D are views exemplifying a change in striking position in the first striking range;

FIGS. 12A to 12D are views exemplifying a change in striking position in the second striking range; and FIGS. 13A to 13D are views exemplifying a change in striking position in the third striking range.

DESCRIPTION OF EMBODIMENTS

The present invention will be described below by way of its exemplary embodiments with reference to the accompanying drawings.

Figure 1:
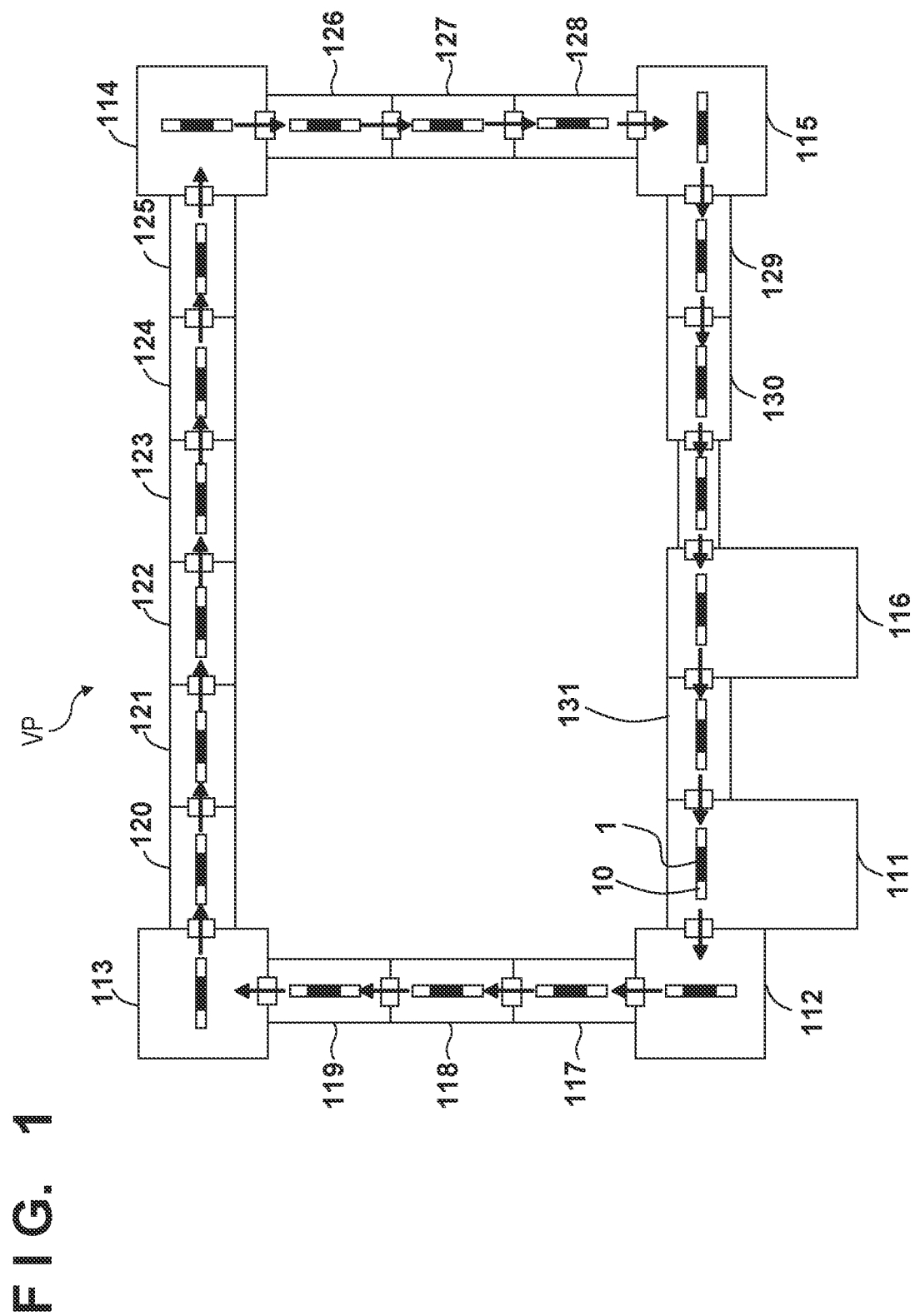
FIG. 1 is a schematic plan view showing the arrangement of a vacuum processing apparatus according to an embodiment of the present invention.

FIG. 1 schematically shows the arrangement of a vacuum processing apparatus VP according to an embodiment of the present invention. The vacuum processing apparatus VP can be arranged as an in-line deposition apparatus. In the vacuum processing apparatus VP, a plurality of processing chambers 111 to 131 are endlessly connected to form a rectangular shape via gate valves. The processing chambers 111 to 131 are vacuum vessels evacuated by a dedicated or shared exhaust system. A conveying device CNV (see FIG. 3) for conveying a carrier 10 which holds a substrate 1 is incorporated in each of the processing chambers 111 to 131.

The conveying device CNV has a convey path for conveying the carrier 10 in a posture in which the main surface of the substrate 1 held by the carrier 10 is maintained to be vertical to the horizontal surface.
The processing chamber 111 is a load lock chamber for performing processing for attaching the substrate 1 to the carrier 10. The processing chamber 116 is an unload lock chamber for performing processing for removing the substrate 1 from the carrier 10. The substrate 1 is suitable for use as, for example, a magnetic recording medium. For example, the substrate 1 can be a metal or glass disc member having an opening (inner peripheral portion) at the central portion. Note that the shape and material of the substrate 1 are not limited to the specific ones.

The processing procedure of a substrate in the vacuum processing apparatus VP will be described below. First, a first substrate 1 is mounted on a first carrier 10 in the processing chamber (load lock chamber) 111. The first carrier 10 is moved to the processing chamber (adhesion layer forming chamber) 117, and an adhesion layer is formed on the first substrate 1. When the first carrier 10 is located in the processing chamber (adhesion layer forming chamber) 117, a second substrate 1 is mounted on a second carrier 10.

After that, the second carrier 10 is moved to the processing chamber (adhesion layer forming chamber) 117, and an adhesion layer is formed on the second substrate 1. A third substrate 1 is attached to a third carrier 10 in the processing chamber (load lock chamber) 111. While each carrier 10 is moved in each of the processing chambers 117 to 131, the substrate 1 is processed in each of the processing chambers 117 to 131.

Each of the processing chambers 117 to 131 is a processing chamber for processing each substrate 1. The processing chambers 117 to 128 can be deposition apparatus processing chambers for forming films such as an adhesion layer, a soft magnetic layer, a seed layer, an intermediate layer, and a magnetic layer. The processing chamber 129 can be a plasma processing apparatus processing chamber for forming a surface protective layer made of, for example, a ta-C film. The processing chamber 130 can be, for example, a processing apparatus chamber for processing the surface of the ta-C film formed in the processing chamber 129. Each of the processing chambers 112 to 115 is a processing chamber including a direction change device for changing the convey direction of the substrate 1 through 90°. The processing chamber 131 is an ashing processing chamber for removing a deposit attached to the carrier 10. The vacuum processing apparatus VP can obtain a structure in which, for example, an adhesion layer, a lower soft magnetic layer, a seed layer, an intermediate layer, a magnetic recording layer, and a ta-C film are sequentially formed on the substrate 1.

Figure 2:
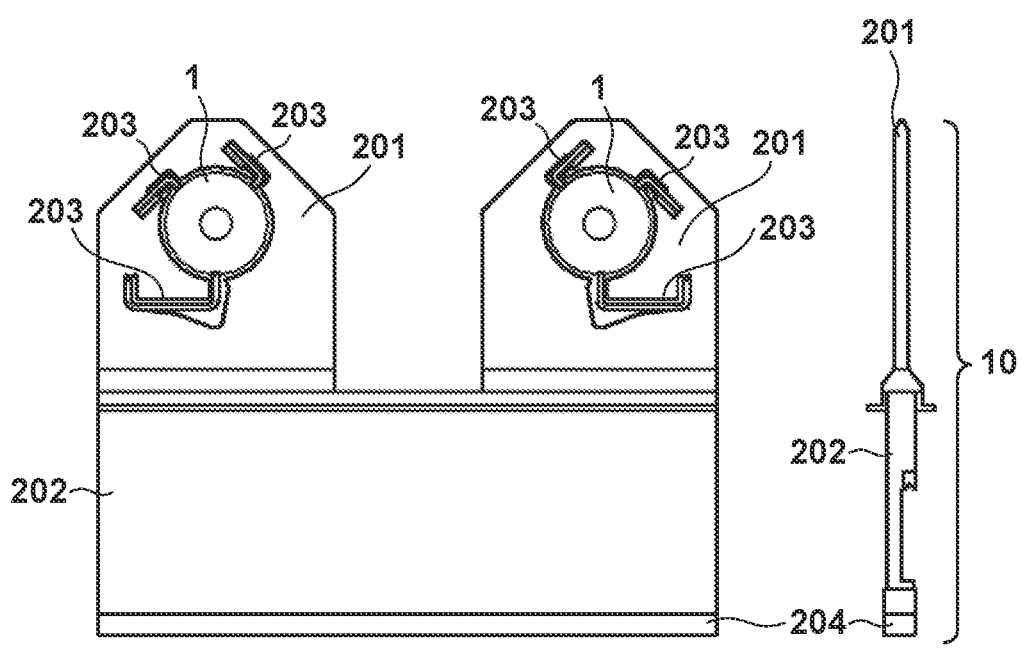
FIG. 2 is a schematic view showing the arrangement of a carrier in the processing apparatus shown in FIG. 1.

FIG. 2 shows an arrangement example of the carrier 10. The carrier 10 can simultaneously hold, for example, two substrates 1. The carrier 10 can include, for example, two metal holders 201 for holding the substrates 1, respectively, and a slider 202 which supports the two holders 201 and moves along the convey path. A permanent magnet 204 for allowing the conveying device CNV to drive the slider 202 is arranged on the slider 202. Each holder 201 grips the substrate 1 at a plurality of peripheral portions by a plurality of conductive elastic members (leaf springs) 203 without covering the front and rear deposition areas of the substrate 1.

Figure 3:
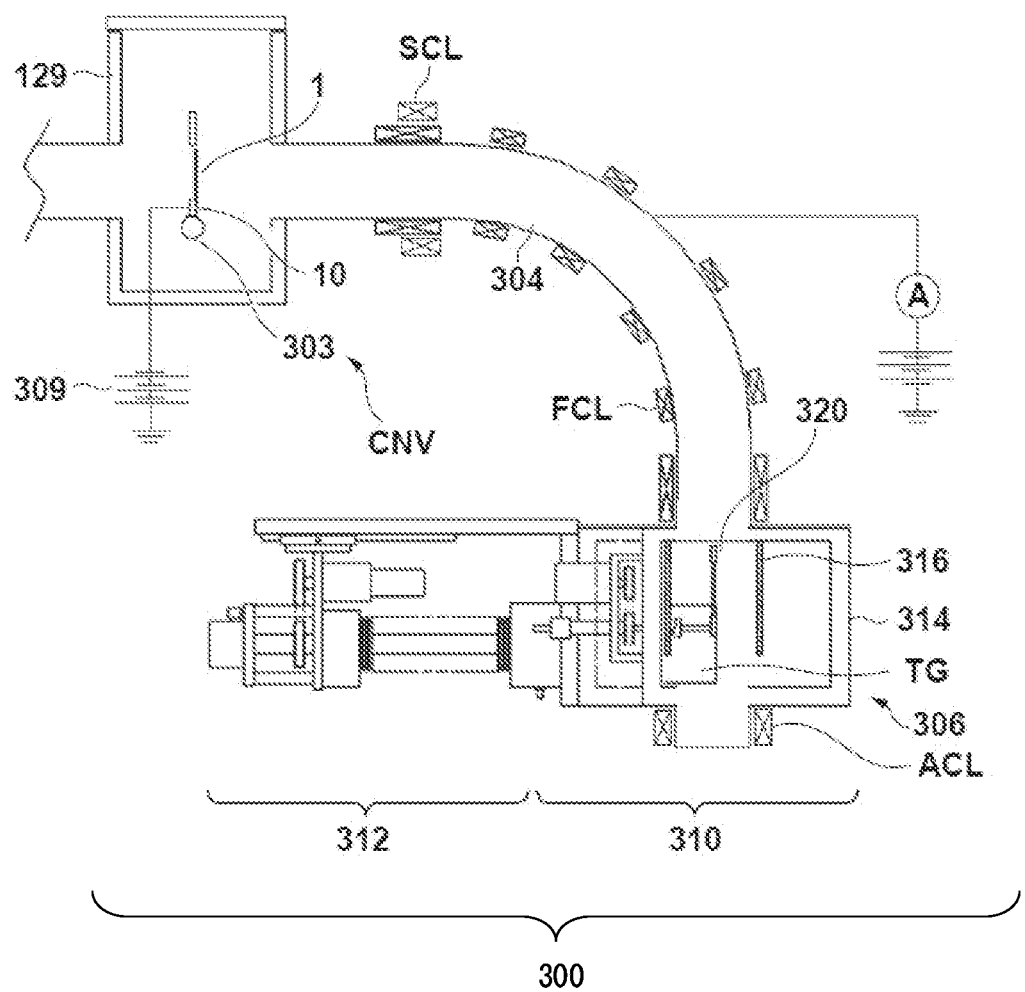
FIG. 3 is a schematic view showing an example of the arrangement of a deposition apparatus.

FIG. 3 schematically shows the arrangement of a deposition apparatus 300 having the processing chamber 129 and the arrangement of the conveying device CNV. The conveying device CNV includes a large number of driven rollers (not shown) arranged along the convey path and a magnetic screw 303 for driving the carrier 10. When the magnetic screw 303 is rotated and driven, the slider 202 (carrier 10) including the permanent magnet 204 is driven along the convey path. A voltage is applied by a power supply 309 via the conductive elastic members 203 to the substrate 1 held by the holder 201 of the carrier 10. Alternatively, the substrate 1 held by the holder 201 can be grounded via the conductive elastic members 203. A DC voltage, a pulse voltage, or a high-frequency voltage can be applied to the holder 201.

The deposition apparatus 300 is arranged to form a ta-C film on the substrate 1 by, for example, vacuum arc deposition. However, this is merely an example. The deposition apparatus 300 may generate a plasma by another method. The deposition apparatus 300 can include a processing chamber 129 for processing the substrate, a plasma generation unit 306 for generating a plasma, and a transport unit 304 for transporting the plasma generated by the plasma generation unit 306 to the processing chamber 129. The deposition apparatus 300 can include a scanning magnetic field generation unit SCL for generating the magnetic field for rotating the plasma so as to scan the substrate 1 by the plasma, and a vacuum pump (not shown) such as a turbomolecular pump for evacuating the processing chamber 129. In this example, the processing chamber 129 is arranged as a deposition chamber for forming a ta-C film on the substrate 1. Although FIG. 3 shows only a set of the transport unit 304 and the plasma generation unit 306, a set of the transport unit 304 and the plasma generation unit 306 is set on each of the two sides of the processing chamber 129 (that is, two sets of the transport units 304 and the plasma generation units 306). Note that if a carrier on which two substrates are mounted is used, four sets of the transport units 304 and the plasma generation units 306 may be used so that the two surfaces of each of the two substrates can be simultaneously processed.

The transport duct 304 can be a single bend transport duct bent two-dimensionally as schematically illustrated in FIG. 3. However, the transport duct 304 may be a linear transport duct, a double bend transport duct, or a three-dimensionally curved transport duct. A filter coil FCL may include a magnetic field generation unit arranged inside (the vacuum side) the transport unit 304. The filter coil FCL forms, in the transport unit 304, a magnetic field for transporting a plasma (electrons and ions). A plurality of baffle plates can be arranged in the transport unit 304.

In this example, although the plasma generation unit 306 generates a plasma by vacuum arc discharge, the plasma may be generated by another method. The plasma generation unit 306 includes an ion generation unit 310 and a target driving unit 312. The ion generation unit 310 can include a chamber 314, the interior of which communicates with the transport unit 304, a target TG as a cathode for generating electrons and ions, an anode electrode, and a striker 320. The ion generation unit 310 can include a target holder 318 for holding (supporting) the target TG, and a stabilizing coil ACL. The striker 320 is a member for generating arc discharge (that is, igniting the discharge) between the target TG and an anode 316. As will be described later, the target driving unit (changing mechanism) 312 can include a rotation unit 322 and a moving unit 324.

The target TG is an ion supply source. In this example, the target TG is a graphite target for forming a ta-C film. However, the target TG may be made of a material (for example, titanium nitride, titanium oxide, chromium nitride, chromium oxide, aluminum nitride, aluminum oxide, zinc nitride, zinc oxide, copper nitride, copper oxide, or an alloy thereof) corresponding to a film to be formed on the substrate 1. In addition, although the target TG has a columnar shape in this embodiment, another shape such as a cylindrical shape or a polygonal shape may be used. The rotation unit 322 rotates or pivots the target about a rotation axis RA in a state in which the target is supported in the horizontal direction while the central axis of the target having a columnar shape matches the rotation axis RA. In addition, the moving unit 324 moves (reciprocates) along the rotation axis RA (the central axis of the target).

The stabilizing coil ACL is arranged on the opposite side of the discharge surface side (on the side of the transport unit 304) of the target TG, thereby forming a magnetic field for stabilizing the arc discharge. The magnetic field generated by the stabilizing coil ACL and the transport magnetic field generated by the filter coil FCL are cusp magnetic fields (magnetic fields in opposite directions). The cusp magnetic fields make it possible to control the behavior of the arc spot, assure the low-load current path between the target TG and the anode 316, and stabilize the arc discharge. A permanent magnet may be arranged in place of the stabilizing coil ACL. The plasma generated by the arc discharge and containing carbon ions is transported to the processing chamber 129 along the transport magnetic field in the transport unit 304, and the ta-C film is formed on the substrate 1 arranged in the processing chamber 129. An inert gas such as argon and/or a reactive gas such as nitrogen gas may be supplied as a process gas to the plasma generation unit 306.

Figure 4:
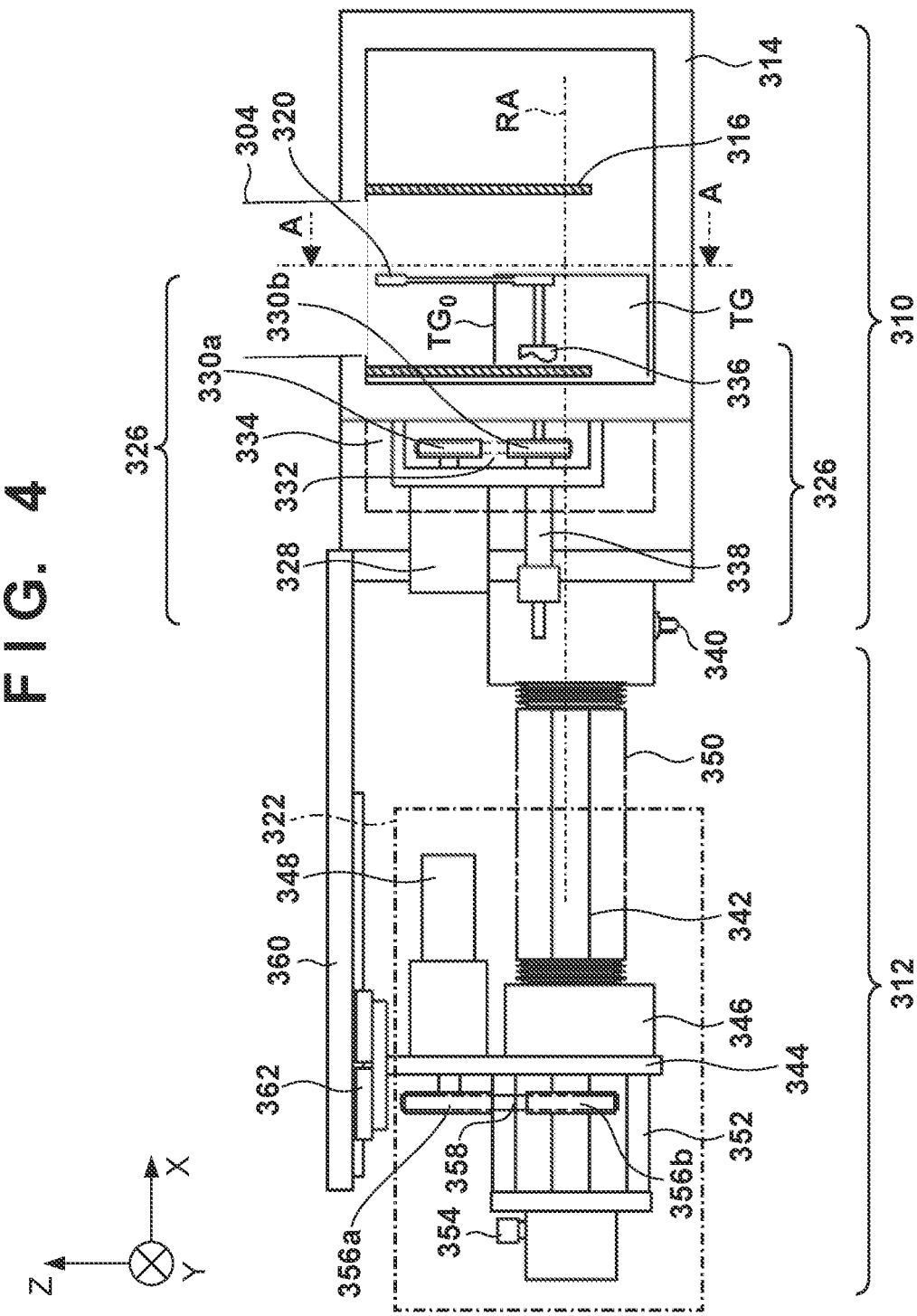
FIG. 4 is an enlarged front view of a plasma generation unit of the deposition apparatus shown in FIG. 3.
Figure 5:
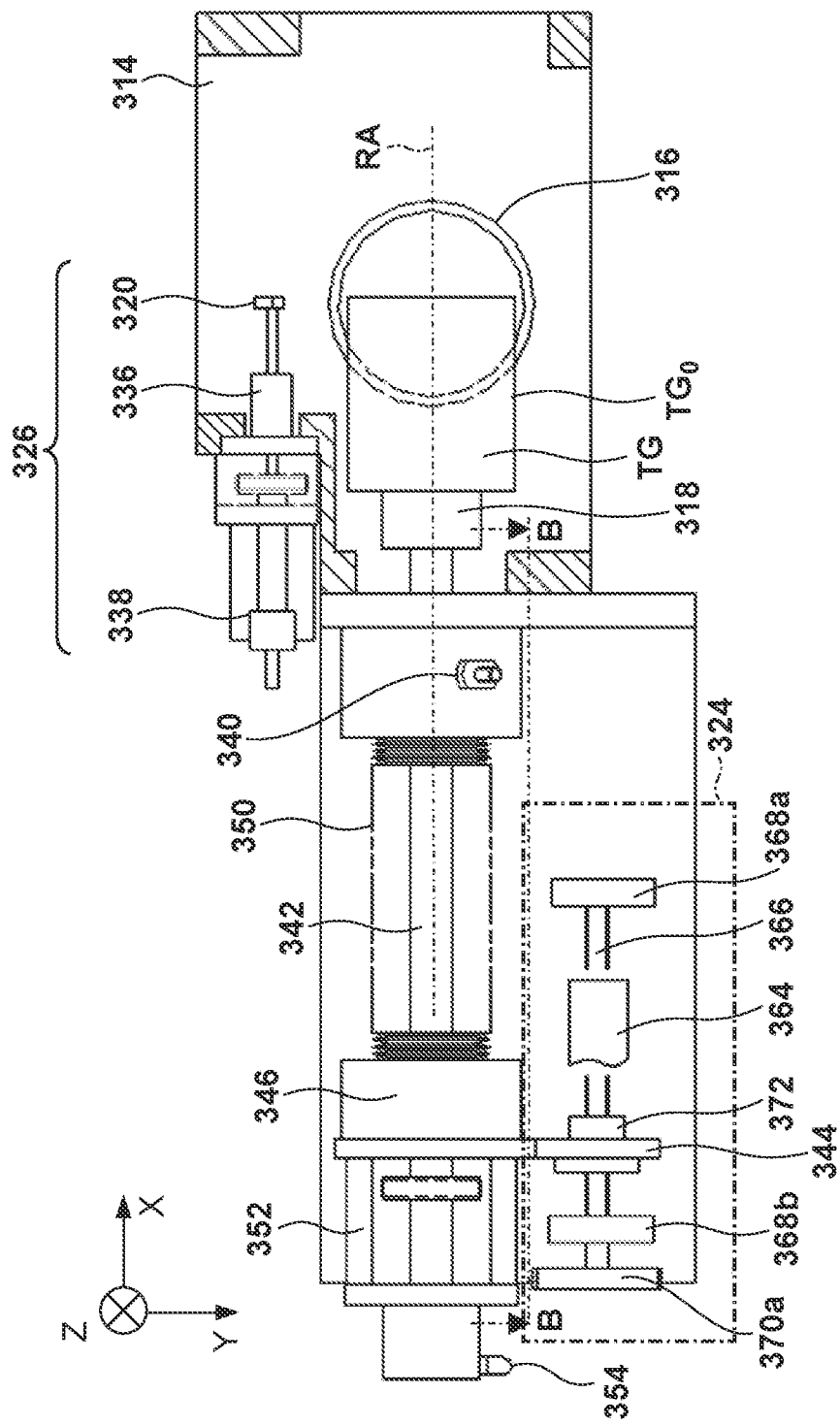
FIG. 5 is an enlarged bottom view of the plasma generation unit of the deposition apparatus shown in FIG. 3.
Figure 6:
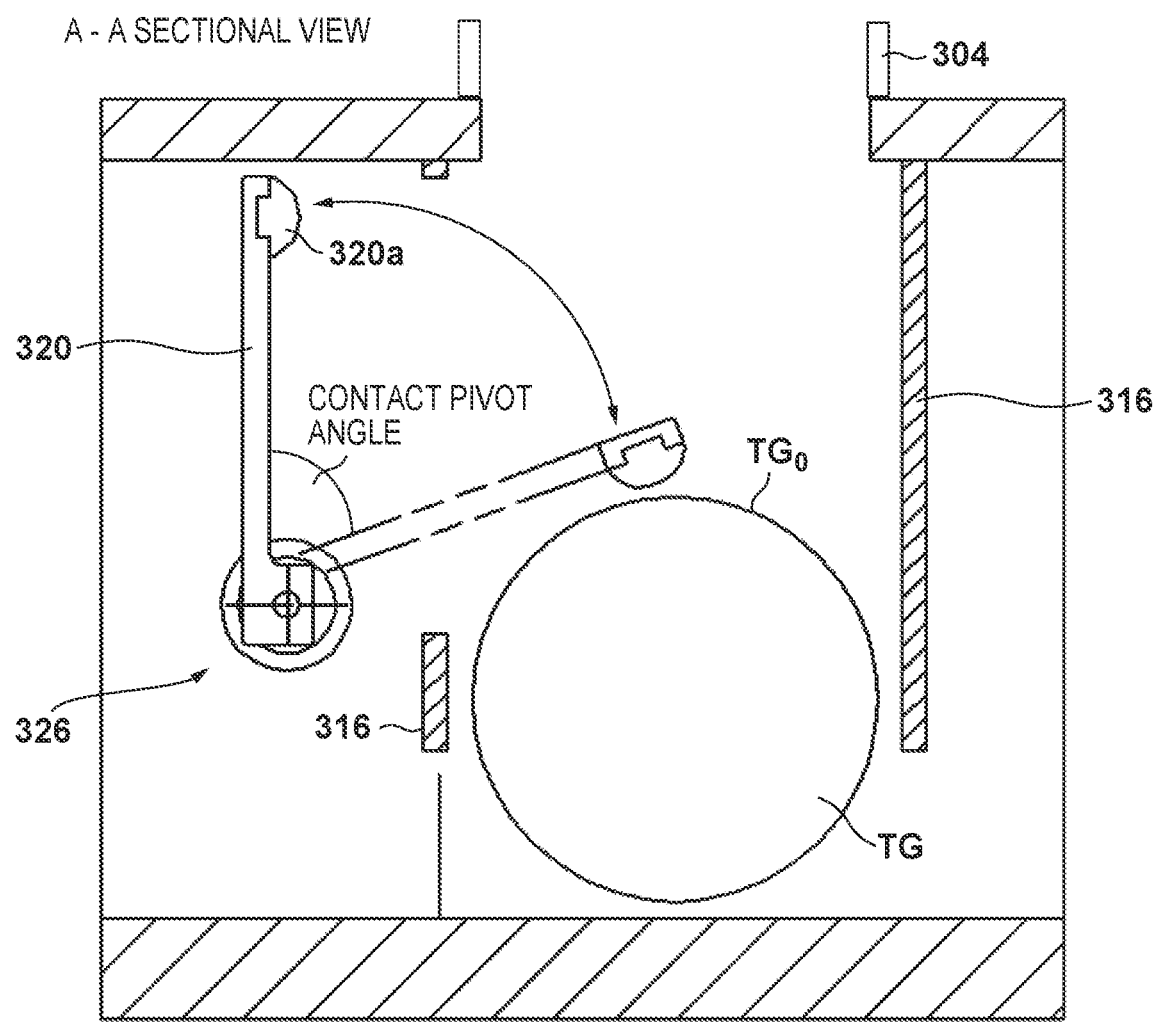
FIG. 6 is a sectional view of a source unit shown in FIG. 4 along a line A-A.
Figure 7:
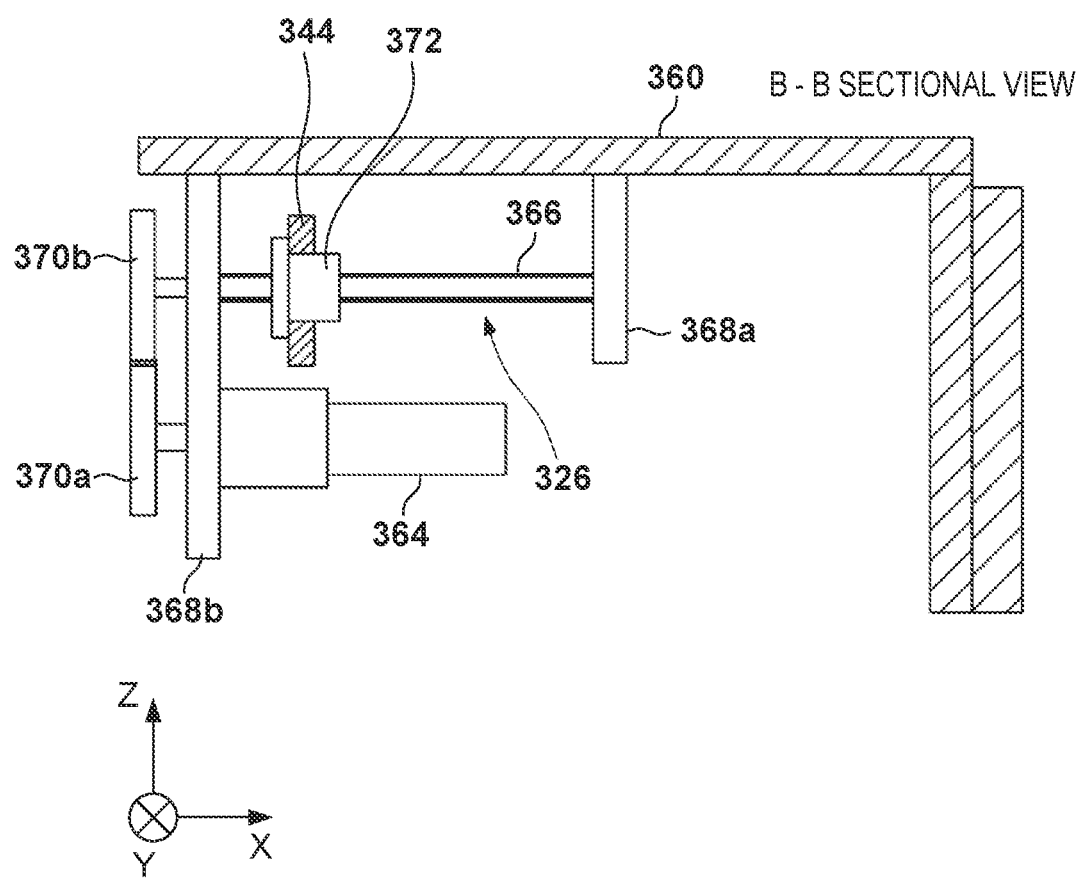
FIG. 7 is a sectional view of the source unit shown in FIG. 5 along a line B-B.

The arrangement of the deposition apparatus 300 will be described in detail with reference to FIGS. 4 to 7. FIG. 4 is an enlarged front view of the plasma generation unit 306. FIG. 5 is an enlarged bottom view of the plasma generation unit 306. FIG. 6 is a sectional view of the plasma generation unit 306 shown in FIG. 4 along a line A-A, and FIG. 7 is a sectional view of the plasma generation unit 306 shown in FIG. 5 along a line B-B.

The stabilizing coil ACL is arranged outside a tubular member. The stabilizing coil ACL is arranged on the outside (outer air side) of the chamber 314 opposite to the discharge surface side (the side of the transport unit 304) of the target TG, and one end of the stabilizing coil ACL is connected to the chamber 314. In this embodiment, the interior of the tubular member in which the stabilizing coil ACL is arranged communicates with the chamber 314 and is kept vacuum. The interior of the chamber 314 can be evacuated and stores the target TG and its surrounding constituent elements, that is, the target TG, the anode 316, and the striker 320. The anode 316 has, for example, a cylindrical shape. The shape of the anode 316 is not limited to a specific one if the shape does not block the transport of the electrons and carbon ions to the transport unit 304. The anode 316 is made of a graphite material. However, the material of the anode 316 may be any one if it is conductive and is not melted by a plasma generated by arc discharge.

The striker 320 is an electrode for inducing the arc discharge between the target TG and the anode 316. The striker 320 retracted outside the anode 316 is driven toward the target TG and is brought into electrical contact with the target TG, and an arc current can flow from the striker 320 to the target TG. In this state, the striker 320 is separated from the target TG so that the arc discharge can be generated. By maintaining the electron current or ion current between the anode 316 and the target TG, the arc discharge can be maintained. By the arc discharge, the carbon ions and electrons are emitted from the target TG, and a plasma containing the carbon ions and electrons is generated. The striker 320 is electrically connected to the anode 316.

The striker 320 includes a discharge portion 320a (the distal end portion), and the discharge portion 320a is electrically connected to the anode 316. The striker 320 is pivoted and driven so that the discharge portion 320a is arranged near an outer circumferential surface $TG_O$ of the target TG. The outer circumferential surface $TG_O$ of the target TG is a side surface of the target TG around (around the rotation axis) of the rotation axis RA of the target TG. In addition, a state in which the discharge portion 320a is arranged near the outer circumferential surface $TG_O$ of the target TG is a state in which arc discharge can be induced between the discharge portion 320a and the outer circumferential surface $TG_O$ of the target TG. In other words, the striker 320 is arranged so that the discharge 320a is pivoted and driven to be in contact with the outer circumferential surface $TG_O$ of the target TG. The contact state between the outer circumferential surface $TG_O$ of the target TG and the discharge portion 320a of the striker 320 does not only indicate that the discharge portion 320a of the striker 320 comes close to and is brought into electrical contact with the outer circumferential surface $TG_O$. The contact state between the outer circumferential surface $TG_O$ of the target TG and the discharge portion 320a of the striker 320 also indicates that the discharge portion 320a of the striker 320 comes close to the outer circumferential surface $TG_O$ to achieve electrical contact. In other words, the contact state between the outer circumferential surface $TG_O$ of the target TG and the discharge portion 320a of the striker 320 indicates that the outer circumferential surface $TG_O$ of the target TG and the discharge portion 320a of the striker 320 are rendered conductive with a low resistance.

As shown in FIG. 6, a striker driving unit 326 can rotate and drive the striker 320 to set a state in which the discharge portion 320a of the striker 320 is located near the outer circumferential surface $TG_O$ of the target TG and in a state in which the discharge portion 320a is away from the outer circumferential surface $TG_O$. The striker driving unit 326 can include, for example, as shown in FIG. 4, a striker motor 328, pulleys 330a and 330b, a belt 332, a motor base 334, and a magnetic seal 336. The striker 320 can be connected to the striker motor 328 via the pulleys 330a and 330b and the belt 332. The striker motor 328 is fixed to the motor base 334 arranged in the chamber 314, and the striker 320 can pivot through a predetermined angle (for example about 90°). Since the striker motor 328 is arranged on the outer air side, the striker driving unit 326 can transmit the rotation force from the outer air side to the vacuum-side striker 320 via the magnetic seal 336. In addition, in this embodiment, to stably supply the current regardless of the pivot angle of the striker 320, the power can be supplied via a rotary connector (rotation introduction unit) 338.

The target TG can be held by the target holder 318. A target power supply terminal 340 is arranged on the outer air side such that a current is supplied to the target TG via the target holder 318. The target holder 318 can be fixed to one end of a shaft 342. The rotation unit 322 is arranged on the other end of the shaft 342. In addition, the moving unit 324 can be arranged so that a base plate 344 which supports the rotation unit 322 can be moved (forward/reverse travel). The shaft 342 can be a member which horizontally supports the target TG. In addition, the shaft 342 can be part of a path for supplying a current to the target TG. In addition, a water channel for causing cooling water for cooling the target TG to flow can be formed inside the shaft 342. The target holder 318 is arranged between the shaft 342 and the target TG and can have functions of fixing the target TG, cooling the target TG, and providing the current path.

The target driving unit 312 can include the rotation unit 322 and the moving unit 324. The target driving unit 312 can arrange the changing mechanism for changing the position for inducing the arc discharge by the striker 320. The rotation unit 322 will be described below. The rotation seal portion 346 of the shaft 342 can be formed on the base plate 344. In addition, a rotation motor 348 can be fixed to the base plate 344 on the outer air side. A bellows 350 is arranged between the chamber 314 and the base plate 344, and the shaft 342 is arranged inside the bellows 350. The interior of the bellows 350 communicates with the chamber 314 and can be kept vacuum. The bellows 350 extends or contracts in accordance with the movement of the base plate 344. A column 352 can be fixed to a coupling 354. The cooling water is supplied, via the coupling 354, to the water channel formed inside the shaft 342. In addition, the cooling water is drained from the water channel. The rotation motor 348 can rotate the shaft 342 via pulleys 356a and 356b and a belt 358.

Next, the moving unit 324 will be described below. A mounting base 360 can be a member fixed to the chamber 314. The base plate 344 can be fixed to the mounting base 360 via an LM guide 362. The LM guide 362 is arranged to move the base plate 344 along the rotation axis RA (the central axis of the target TG) of the rotation unit 322. The LM guide 362 can be arranged by a ball screw 366 and a nut 372. As shown in FIG. 7, a moving motor 364 and the ball screw 366 can be fixed to the mounting base 360. More specifically, the ball screw 366 can be supported by a first plate 368a and a second plate 368b mounted on the mounting base 360. The moving motor 364 is arranged to be fixed to the second plate 368b and rotate the ball screw 366 via gears 370a and 370b. In addition, the base plate 344 can be fixed to the nut 372 moved (forward/reverse travel) upon rotation of the ball screw 366. Accordingly, a portion attached to the base plate 344 can be moved by rotation of the moving motor 364. As described above, one end of the shaft 342 and one end of the bellows 350 can be attached to the base plate 344.

Figure 8:
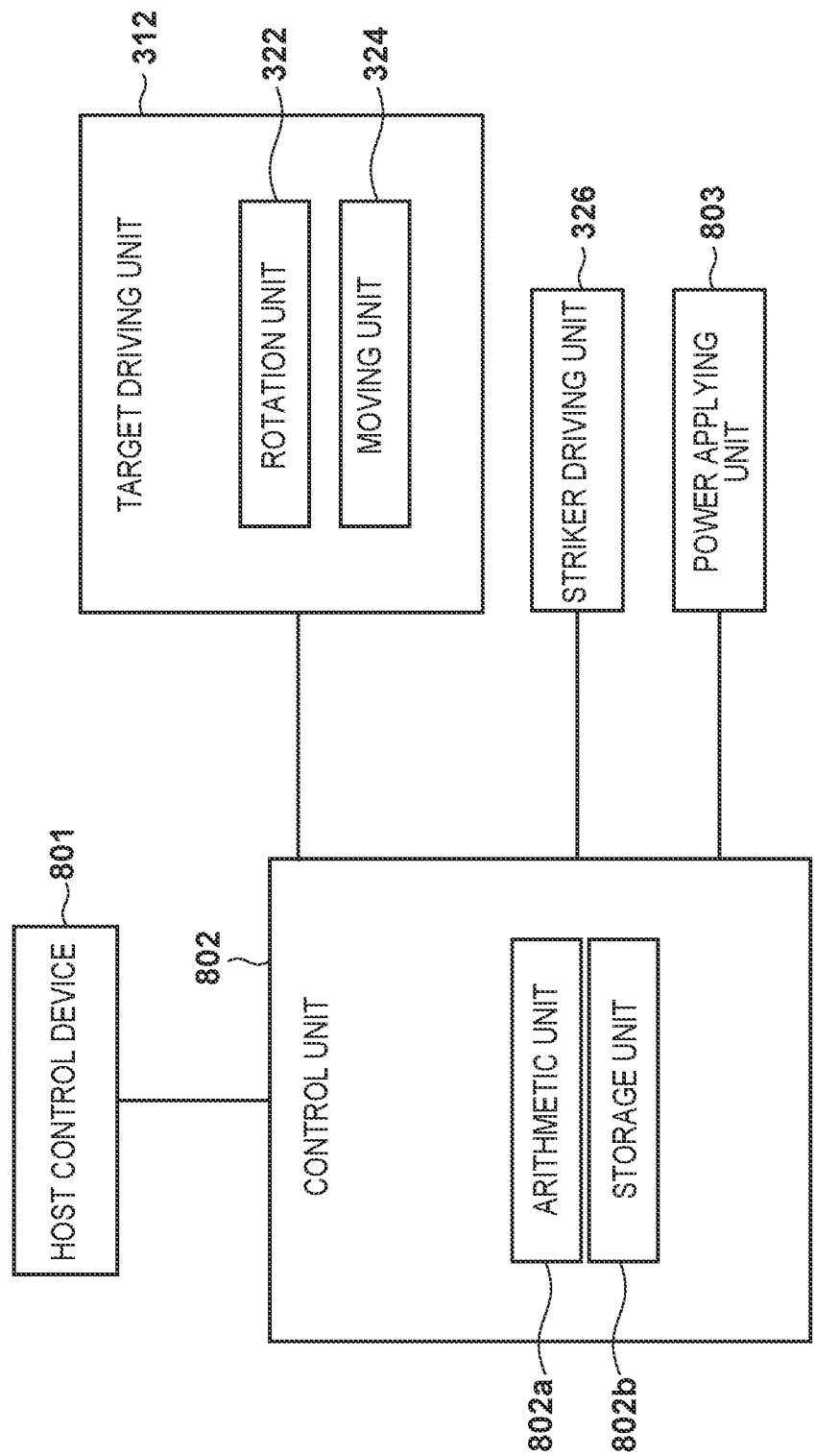
FIG. 8 is a view showing a system arrangement for controlling the operation of the deposition apparatus.

FIG. 8 is a view showing the system arrangement for controlling the operation of the deposition apparatus 300, that is the operation about processing for irradiating the substrate 1 with the ions generated from the target TG by the arc discharge to form a film on the substrate 1. The deposition apparatus 300 includes a control unit 802, and a command (a control signal) from a host control device 801 can be supplied to the control unit 802. The control unit 802 can be arranged to control the target driving unit 312 (the changing mechanism), the striker driving unit 326, and a power applying unit 803 in accordance with the commands from the host control device 801. The control unit 802 can be arranged to transmit signals from the target driving unit 312 (the changing mechanism), the striker driving unit 326, and the power applying unit 803 to the host control device 801. The control unit 802 can be arranged by, for example, a PLD (abbreviated form of Programmable Logic Device) such as an FPGA (abbreviated form of Field Programmable Gate Array), an SCIC (abbreviated form of Application Specific Integrated Circuit), a program-installed general-purpose computer, or a combination of all or some components. The host control device 801 has a function of controlling the overall vacuum processing apparatus VP, and is arranged to control systems of, for example, a substrate conveying system such as a conveying device, a gate valve or a conveying robot, and other process chambers.

The control unit 802 can be arranged as a device including an arithmetic unit 802a and a storage unit 802b. The arithmetic unit 802a performs arithmetic operations of the signals from the target driving unit 312, the striker driving unit 326, and the power applying unit 803 to obtain current values and change amounts. The storage unit 802b can store the current values and the change amounts of the target driving unit 312, the striker driving unit 326, and the power applying unit 803, the control information, and the like. The storage unit 802b can be arranged to return, to the arithmetic unit 802a, the stored values (the current values and the change amounts of the target driving unit 312, the striker driving unit 326, and the power applying unit 803) in accordance with signals read out from the arithmetic unit 802a.

The target driving unit 312 includes the rotation unit 322 and the moving unit 324 as described above and can be arranged to rotate or pivot the target TG and move (forward/reverse travel) the target TG. The striker driving unit 326 can drive the striker 320 to set a state in which the discharge portion 320a of the striker 320 is arranged near the outer circumferential surface $TG_O$ of the target TG and a state in which the discharge portion 320a of the striker 320 is away from the outer circumferential surface $TG_O$. Each of the target driving unit 312 and the striker driving unit 326 can include a motor including a sensor (for example, an encoder) for detecting an operation amount such as a pivot angle. In other words, the target driving unit 312 and the striker driving unit 326 are arranged as driving sources capable of controlling the operation amounts (for example, a position and an angle).

The power applying unit 803 supplies a voltage (power) for inducing the arc discharge between the target TG and the anode 316. The power applying unit 803 is arranged as, for example, a power supply and may include a sensor such as a resistance meter. The power applying unit 803 can include a power supply for supplying power to the stabilizing coil ACL, a power supply for supplying power to the filter coil FCL, a power supply for supplying power to the scanning magnetic field generation unit SCL, a power supply for applying a bias voltage to the transform unit 304, and the like.

After driving of the target TG by the target driving unit 312 is completed, the striker 320 can drive the striker driving unit 326 in accordance with a control signal from the control unit 802. After driving of the striker 320 by the striker driving unit 326 is completed (that is, after the discharge portion 320a of the striker 320 is arranged near the outer circumferential surface of the target TG), the power applying unit 803 applies a voltage between the target TG and the striker 320. The determination for the fact that the discharge portion 320a of the striker 320 is arranged near the outer circumferential surface of the target TG is performed by, for example, detecting that the rotation speed of the striker motor 328 for driving (pivoting) the striker 320 becomes zero. This determination may be performed based on an elapsed time from the start of pivotal operation of the striker motor 328 or based on a torque.

The power applying unit 803 can apply the voltage between the target TG and the striker 320 for a period from a state in which the discharge portion 320a of the striker 320 is arranged near the outer circumferential surface of the target TG until the discharge portion 320a is separated from the outer circumferential surface of the target TG. More specifically, the state in which the striker 320 is arranged near the outer circumferential surface of the target TG is maintained for the predetermined time, and the power applying unit 803 can apply the voltage between the target TG and the striker 320 for this predetermined time. After the voltage is applied to the power applying unit 803, the striker driving unit 326 can retract the striker 320, and the target TG and the striker 320 can be separated. With this control, the arc discharge can be stably generated. Note that after the end of the arc discharge, the target TG is pivoted by the rotation unit 322 by a predetermined angle, and/or the target TG can be moved (retracted) by the moving unit 324 by a predetermined distance.

The deposition apparatus 300 can be arranged to support the target in a state in which the central axis of the target TG having a columnar shape is kept horizontal and generate the arc discharge on the outer circumferential surface $TG_0$ of the target TG. Since the deposition apparatus 300 can pivot and/or move the target TG by the target driving unit 312, the arc discharge can be generated at any position on the outer circumferential surface $TG_0$ of the target TG.

The arc discharge is induced in a state in which the discharge portion 320a of the striker 320 is arranged near the outer circumferential surface of the target TG. In this case, an arc spot is formed at an arc discharge generated portion (an opposite position) of the outer circumferential surface $TG_0$ of the target TG, and this portion is eroded to form a defective portion. In the deposition apparatus 300, the target TG is driven so that the defective portion caused by the arc discharge or a perspective arc spot formation position (the position (to be also referred to as a striking position) at which the arc discharge is induced by the striker 320) comes close to a defective portion already formed by the arc discharge. Accordingly, the target TG is uniformly eroded, and the portion available as the target TG need not be trimmed by a processing machine such as a grinder. Accordingly, the arc discharge can be stably generated while improving the use efficiency of the target TG. In addition, in the deposition apparatus 300, the step of trimming the target TG by the processing machine need not be inserted between the deposition steps. The decrease in throughput and the generation of the errors of the target driving unit 312 and the striker driving unit 326 which are caused by chips of the target TG can be suppressed. In addition, uniform films can be continuously formed.

An operation of changing the position (the striking position) where the arc discharge is induced by the striker in the set striking range (the set region) will be described together with the deposition operation for forming a film on the substrate with reference to FIGS. 9A to 9F. This operation can be implemented by control of the target driving unit 312 and the striker driving unit 326 by the control unit 802.

Figure 9A:
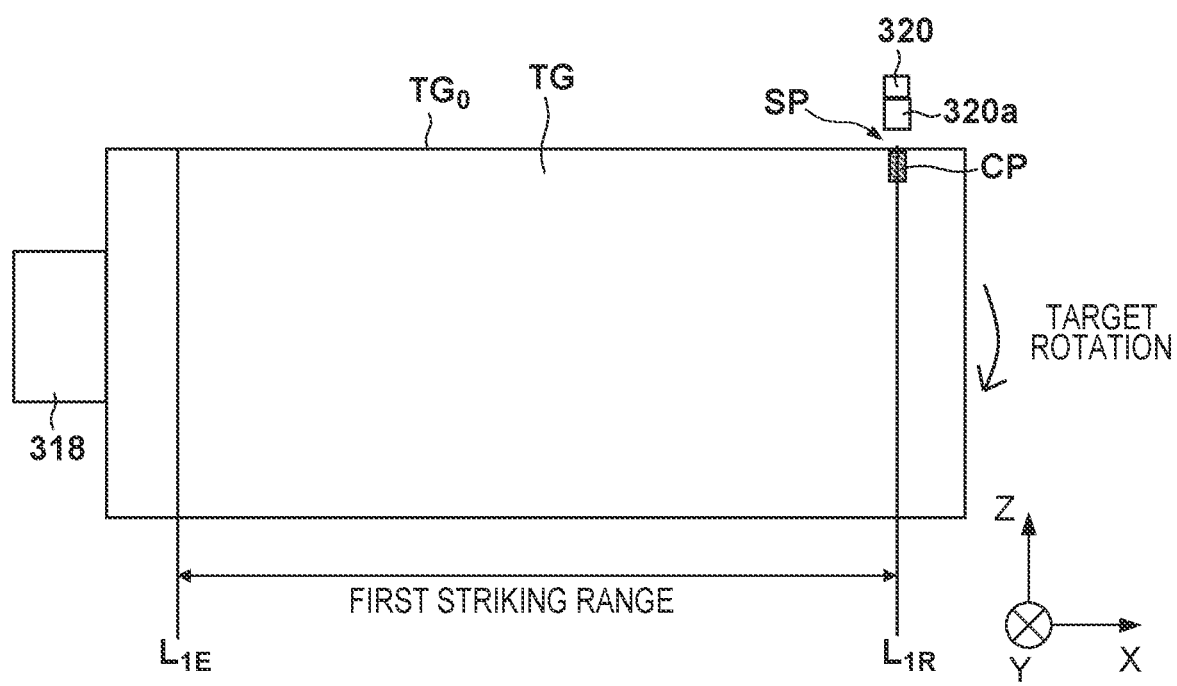
FIGS. 9A to 9F are views for explaining an operation for changing a position (striking position) where arc discharge is induced by a striker in a set striking range (a set region), together with a deposition operation for forming a film on a substrate.

First, as shown in FIG. 9A, the target driving unit 312 drives the target TG such that the target TG and the discharge portion 320a of the striker 320 are brought into contact with each other at a striking position SP (the position of the forward/reverse traveling direction (X direction)=$L_{1R}$ and the pivot angle=0) located at the first end of a first striking range ($L_{1R}$–$L_{1E}$) of the outer circumferential surface $TG_0$ of the target TG. The striking range is a range in which the striking position can be moved (changed). In other words, the striking range is a region set in the target TG, and the striking position can be changed in this region. The striking position can be specified by the forward/reverse traveling position of the target TG and the pivot angle of the target TG on the outer circumferential surface $TG_0$ of the target TG.

The striker driving unit 326 drives the striker 320, the outer circumferential surface $TG_0$ of the target TG is brought into contact with the discharge portion 320a of the striker 320, and arc discharge is induced at the striking position SP. Accordingly, the arc spot is formed at the contact position (the striking position S) with the discharge portion 320a of the striker 320 on the outer circumferential surface $TG_0$ of the target TG. A defective portion CP can be formed by the arc discharge. In addition, after the arc discharge is induced, the striker driving unit 326 drives the striker 320, and the discharge portion 320a of the striker 320 is separated from the striking position SP (the position of the forward/reverse traveling direction=$L_{1R}$ and the pivot angle=0). This arc discharge is maintained for deposition of a film on the substrate, and a film is formed on the substrate by a plasma (ions) formed by the arc discharge. While this arc discharge is maintained, the defective portion CP formed on the target TG can be enlarged.

Figure 9B:
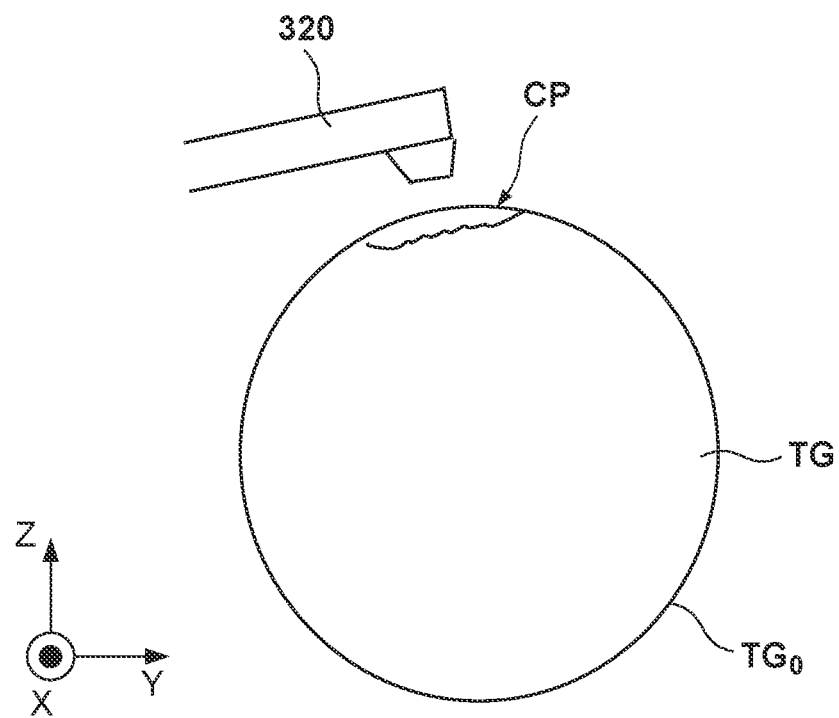

Next, as shown in FIG. 9B, the target driving unit 312 (the rotation unit 322) pivots the target TG about the rotation axis RA by the pivot angle θ so that the arc spot to be formed on the outer circumferential surface $TG_0$ of the target TG by arc discharge is moved on the outer circumferential surface $TG_0$. The striker driving unit 326 drives the striker 320, the outer circumferential surface $TG_0$ of the target TG and the discharge portion 320a of the striker 320 are brought into contact with each other at the striking position SP (the position of the forward/reverse traveling direction=$L_{1R}$ and the pivot angle=θ), and arc discharge is induced. Accordingly, an arc spot is formed at the contact position (the striking position SP) with the discharge portion 320a of the striker 320 on the outer circumferential surface $TG_O$ of the target TG, and a new defective portion CP can be formed by the arc discharge (in other words, the defective portion CP can be enlarged). In addition, after the arc discharge is induced, the striker driving unit 326 drives the striker 320 to separate the discharge portion 320a of the striker 320 from the striking position SP (the position of the forward/reverse traveling direction=$L_{1R}$ and the pivot angle=0). This arc discharge is maintained for deposition of a film on the substrate, and a film is formed on the substrate by a plasma (ions) formed by the arc discharge. While this arc discharge is maintained, the defective portion CP formed on the target TG can be enlarged.

Next, the target driving unit 312 (the rotation unit 322) pivots the target TG about the rotation axis RA by the pivot angle θ so that the arc spot to be formed on the outer circumferential surface $TG_O$ of the target TG by arc discharge is moved on the outer circumferential surface $TG_O$.

Figure 9C:
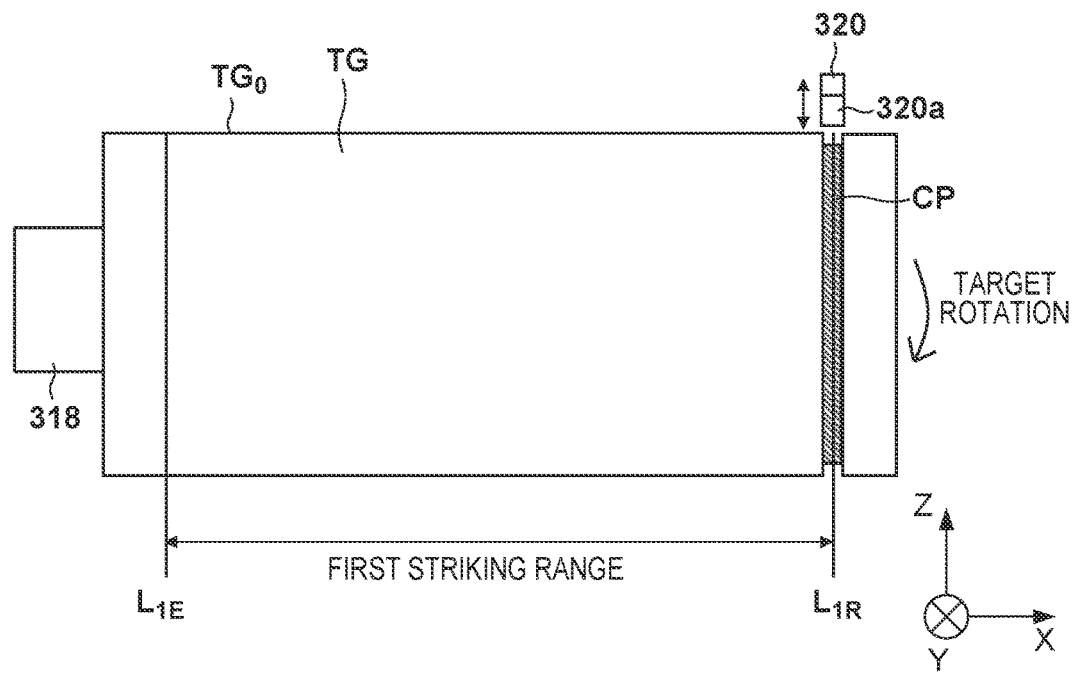

As described above, by repeating the arc discharge and the pivotal operation of the target TG, the defective portion CP is circumferentially formed at the strike position=$L_{1R}$ located at the first end of the first striking range of the outer circumferential surface $TG_O$ of the target TG, as shown in FIG. 9C. In an example, at the striking position=$L_{1R}$, the target TG is rotated by two rotations about the rotation axis RA.

Figure 9D:
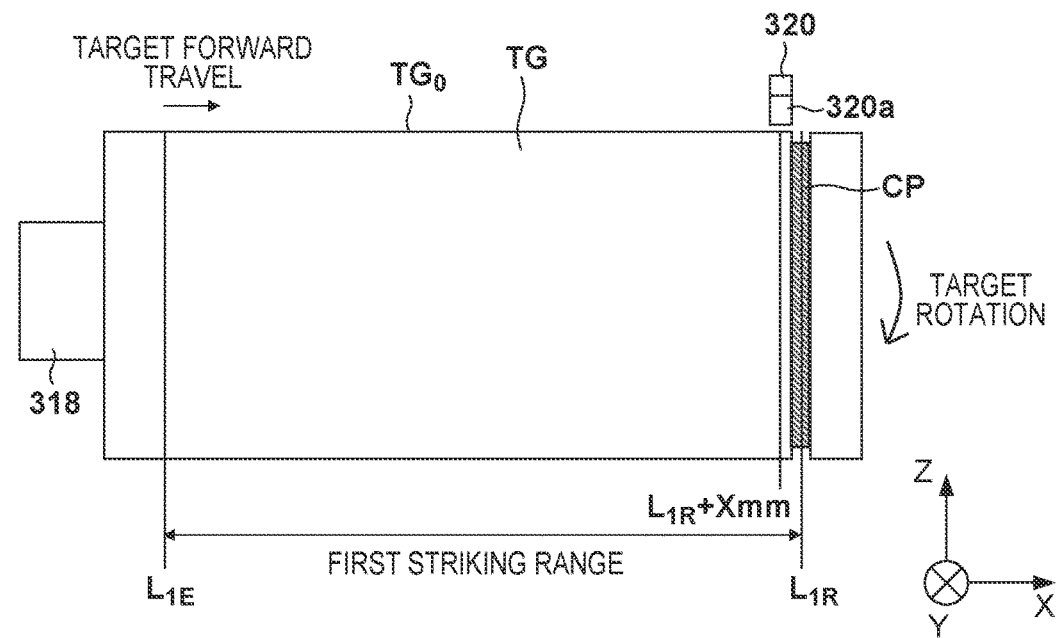

After the defective portion CP is circumferentially formed at the striking position=$L_{1R}$ located at the first end of the first striking range of the outer circumferential surface $TG_O$ of the target TG, the target driving unit 312 (the moving unit 324) moves the target by Xmm in the forward traveling direction (+X direction) along the rotation axis RA, as shown in FIG. 9D. In this case, the target TG is moved by Xmm in the forward traveling direction such that the circumferential defective portion CP already formed on the target by the arc discharge is adjacent to a defective portion CP to be formed on the target TG by subsequent arc discharge or these defectively portions partially overlap. The outer circumferential surface $TG_O$ of the target TG is brought into contact with the discharge portion 320a of the striker 320 at the striking position SP (the position of the forward/reverse traveling direction=$L_{1R}$+X and the pivot angle=0), and arc discharge is induced. Accordingly, an arc spot is formed at the striking position SP, and a new defective portion CP can be formed by the arc discharge (the defective portion CP can be enlarged). In addition, after the arc discharge is induced, the striker driving unit 326 drives the striker 320 to separate the discharge portion 320a of the striker 320 from the striking position SP. This arc discharge is maintained for deposition of a film on the substrate, and a film is formed on the substrate by a plasma (ions) formed by the arc discharge. While this arc discharge is maintained, the defective portion CP formed on the target TG can be enlarged.

Next, the target driving unit 312 (the rotation unit 322) pivots the target TG about the rotation axis RA by the pivot angle θ so that the arc spot to be formed on the outer circumferential surface $TG_O$ of the target TG by arc discharge is moved on the outer circumferential surface $TG_O$. The striker driving unit 326 drives the striker 320, the outer circumferential surface $TG_O$ of the target TG and the discharge portion 320a of the striker 320 are brought into contact with each other at the striking position SP (the position of the forward/reverse traveling direction=$L_{1R}$+X and the pivot angle=θ), and arc discharge is induced. Accordingly, an arc spot is formed at the contact position (the striking position SP) with the discharge portion 320a of the striker 320 on the outer circumferential surface $TG_O$ of the target TG, and a new defective portion CP can be formed by the arc discharge (in other words, the defective portion CP can be enlarged). In addition, after the arc discharge is induced, the striker driving unit 326 drives the striker 320 to separate the discharge portion 320a of the striker 320 from the striking position SP (the position of the forward/reverse traveling direction=$L_{1R}$ and the pivot angle=0). This arc discharge is maintained for deposition of a film on the substrate, and a film is formed on the substrate by a plasma (ions) formed by the arc discharge. While this arc discharge is maintained, the defective portion CP formed on the target TG can be enlarged.

Next, the target driving unit 312 (the rotation unit 322) pivots the target TG about the rotation axis RA by the pivot angle θ so that the arc spot to be formed on the outer circumferential surface $TG_O$ of the target TG by arc discharge is moved on the outer circumferential surface $TG_O$.

Figure 9E:
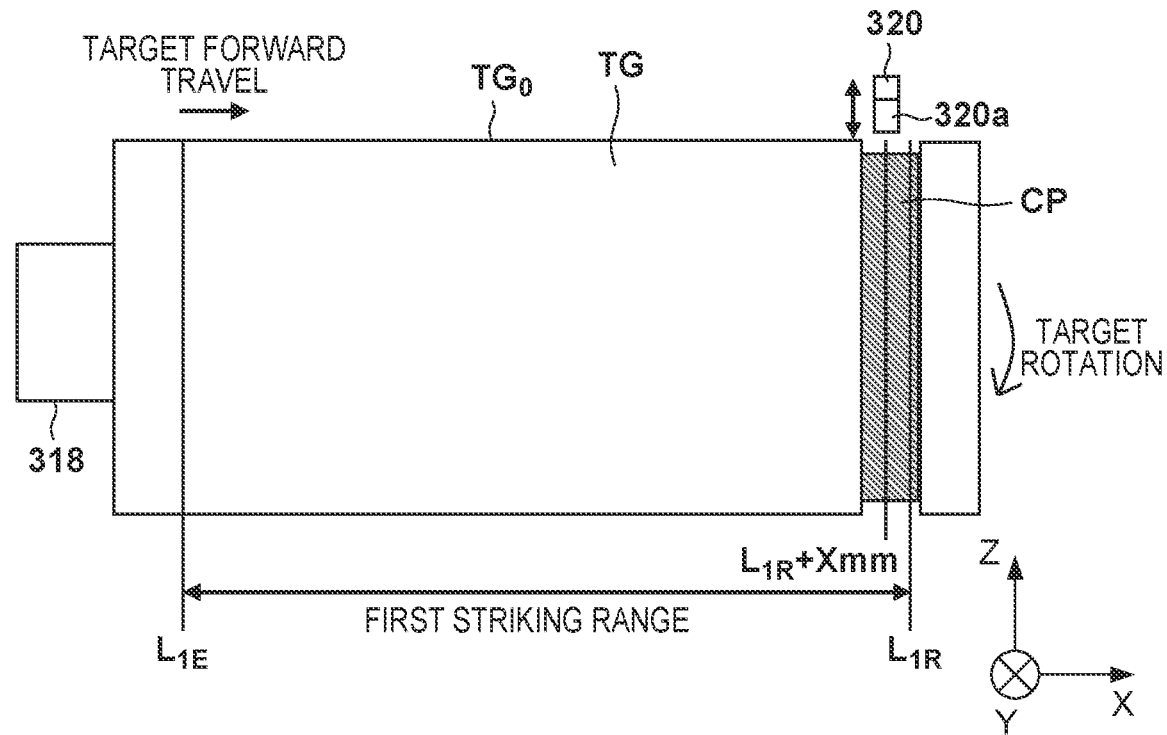

As described above, by repeating the arc discharge and the pivotal operation of the target TG, the defective portion CP is circumferentially formed at the strike position=$L_{1R}$+X, as shown in FIG. 9E. In an example, at the striking position=$L_{1R}$+X, the target TG is rotated by one rotation about the rotation axis RA. In this case, one rotation of the target TG can be performed by a plurality of pivot operations of the target TG.

Figure 9F:
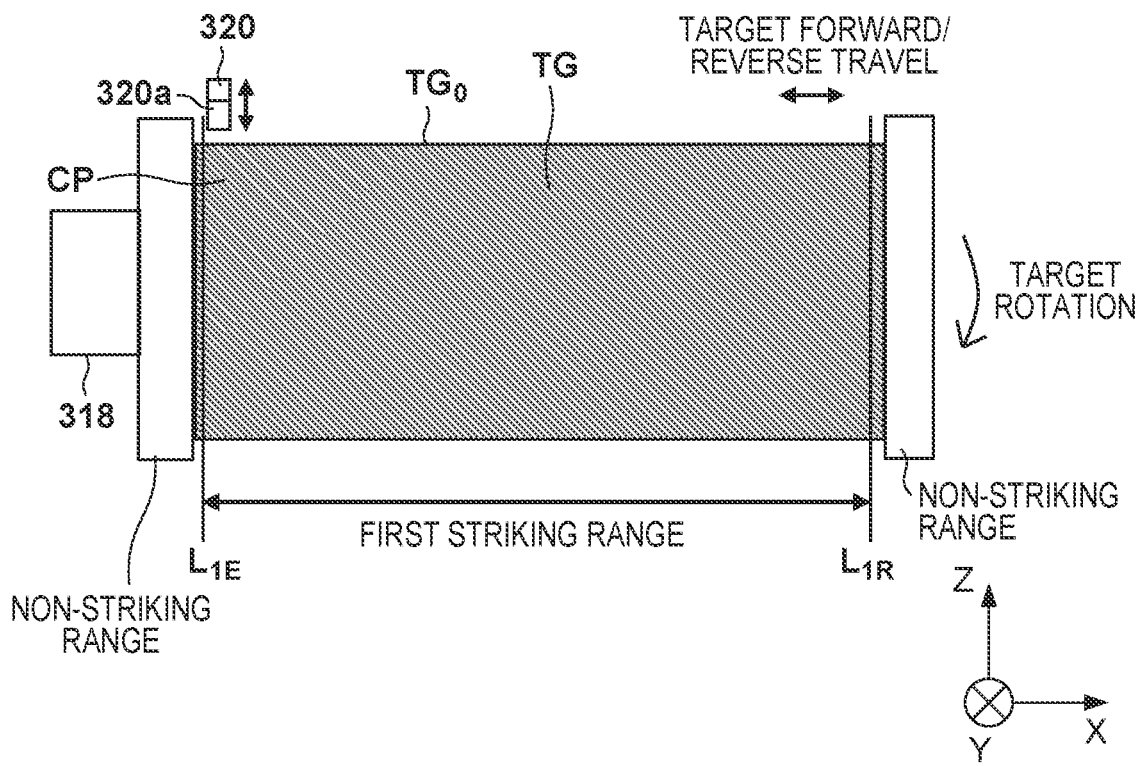

The above operation is repeated until the striking position=$L_{1E}$ located at the second end of the first striking range. Accordingly, as shown in FIG. 9F, the defective portion CP by the arc spots can be formed on the entire part of the first striking range. On the other hand, no arc spot is generated in a non-striking range which falls outside the striking range. Neither the target is eroded nor the defective portion CP is formed. As a result, steps can be formed in the boundary between the first end of the first striking range and the non-striking range and the boundary between the second end of the first striking range and the non-striking range.

In an example, the target TG is rotated by two rotations about the rotation axis RA at a second end $L_{1E}$ of the first striking range. That is, the target TG is rotated by two rotations about the rotation axis RA at a first end $L_{1R}$ of the first striking range and the second end $L_{1E}$ of the striking range. The target TG is rotated by one rotation at a striking position other than the first end of the first striking range and the second end of the striking range. According to this control, the arc discharge generation operations at the respective striking positions SP are equal to each other, and the target TG can be uniformly eroded.

In the deposition method of this embodiment, the changing step and the deposition step which change the striking position (that is, the position where the arc discharge is induced by the striker) in the striking range (the set region) can be repeated while reducing the striking range. In other words, the deposition method of the present invention includes the changing step of changing the striking position in the striking range, the deposition step of forming the film on the substrate by using the plasma generated by inducing the arc discharge at the striking position, and the reduction step of reducing the striking range.

After the cycle including the changing step and at least one deposition step is repeated, the reduction step is performed. After that, this cycle is repeated. In the reduction step, the striking range is reduced so that the reduced striking range falls within the striking range before the reduction. In the changing step, the striking position can be changed by pivoting the target TG. In the changing step, the striking position is further changed by moving the target TG in a direction parallel to the rotation axis of the target TG.

Figure 10A:
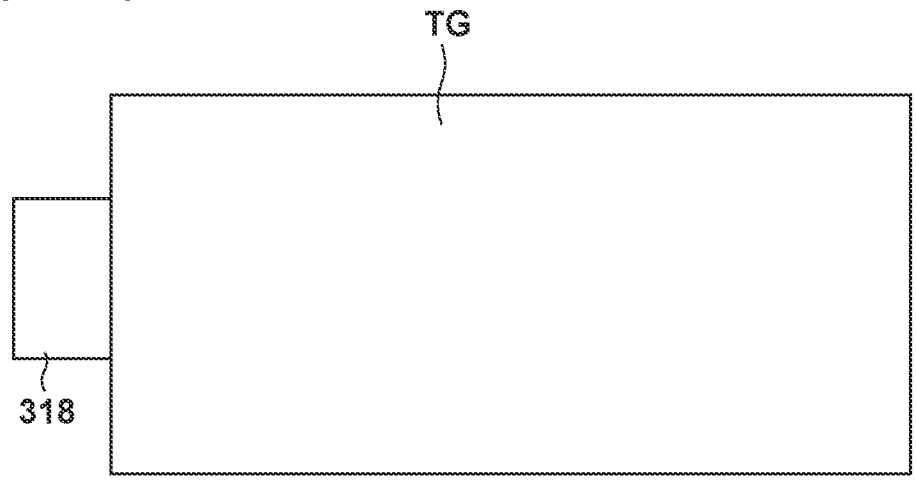
FIGS. 10A to 10E are views for explaining a changing step, a deposition step, and a reduction step.
Figure 10B:
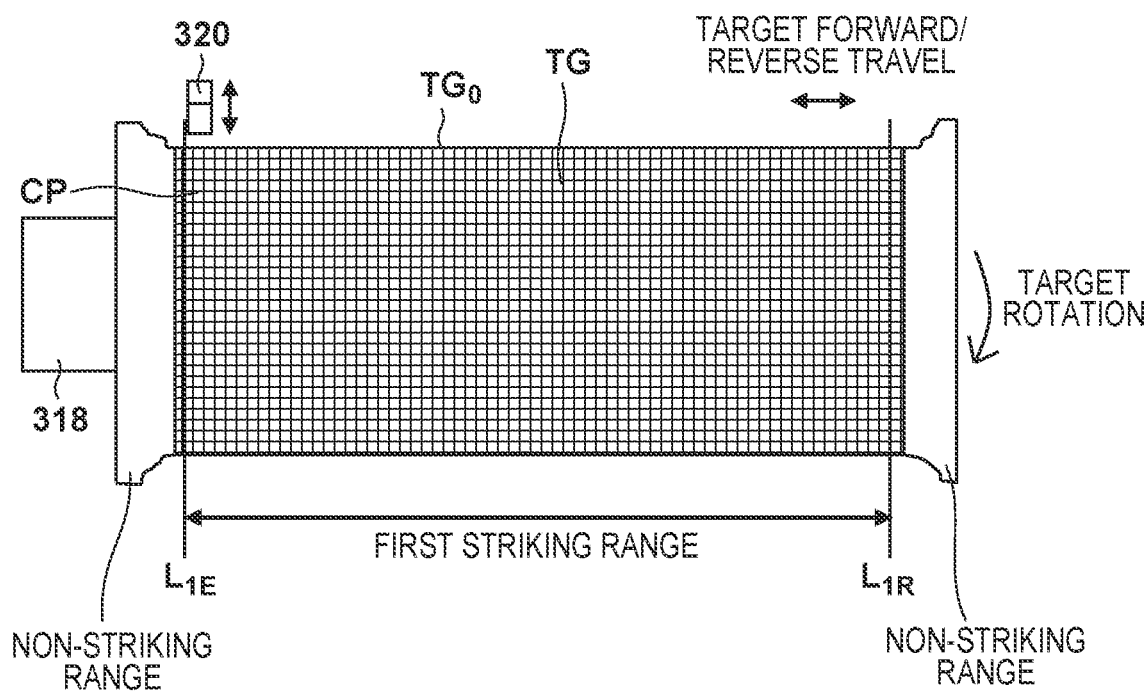
Figure 10C:
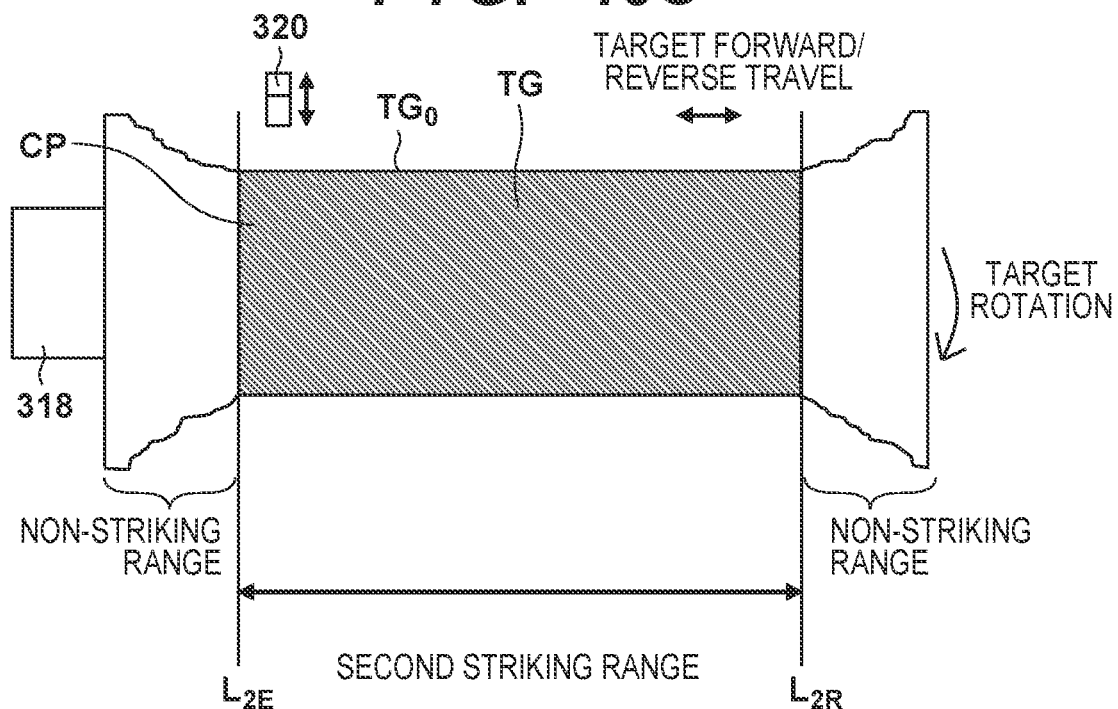
Figure 10D:
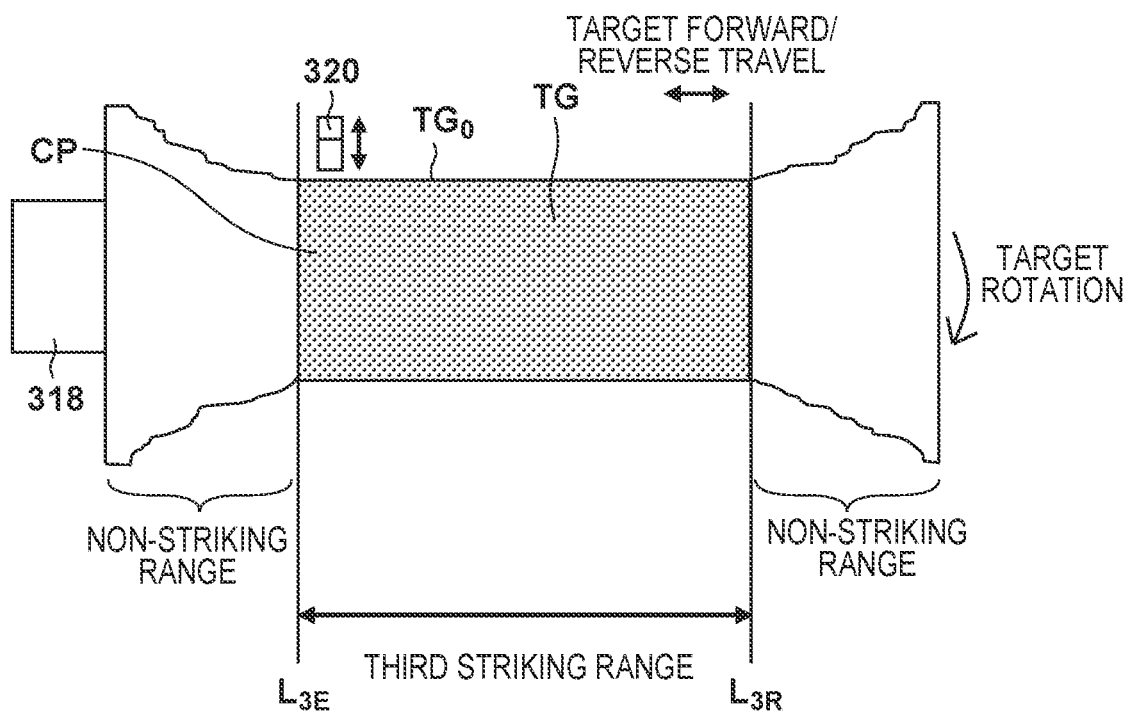

The changing step, the deposition step, and the reduction step according to this embodiment will be described below with reference to FIGS. 10A to 10E. FIG. 10A exemplifies an unused target TG. After the target TG is fixed on the target holder 318, the changing step of changing the striking position within the first striking range is performed, and the deposition step is performed at each striking position, as shown in FIG. 10B. After that, steps can be formed at the boundary between the first end $L_{1R}$ of the first striking range and the non-striking range and the boundary between the second end $L_{1E}$ of the first striking range and the non-striking range. However, before arc discharge generated at each boundary becomes unstable, the striking range is changed (reduced) from the first striking range ($L_{1R}$–$L_{1E}$) to the second striking range ($L_{2R}$–$L_{2E}$) exemplified in FIG. 10C.

Subsequently, the changing step of changing the striking position in the second striking range is performed, and the deposition step is performed at each striking position. After that, steps can be formed at the boundary between the first end $L_{2R}$ of the second striking range and the non-striking range and the boundary between the second end $L_{1E}$ of the second striking range and the non-striking range. However, before arc discharge generated at each boundary becomes unstable, the striking range is changed (reduced) from the second striking range ($L_{2R}$–$L_{2E}$) to the third striking range ($L_{3R}$–$L_{3E}$) exemplified in FIG. 10D. Next, the changing step of changing the striking position within the third striking range is performed, and at the same time the deposition step is performed at each striking position.

Figure 10E:
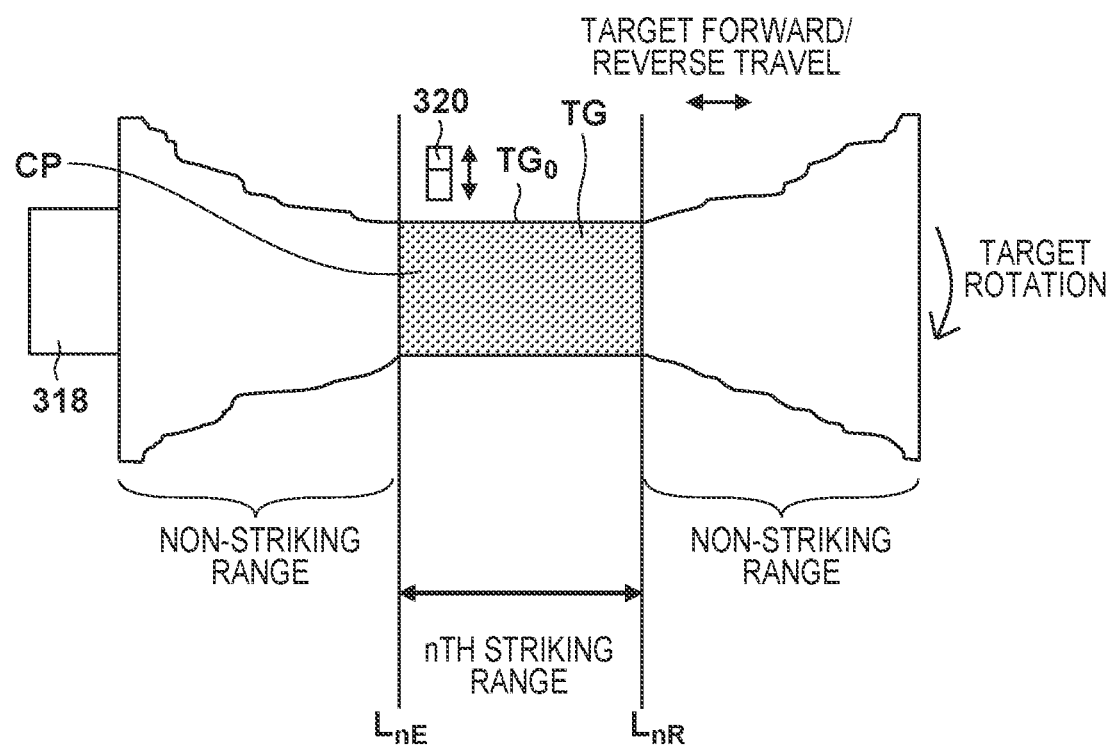
Figure 11D:
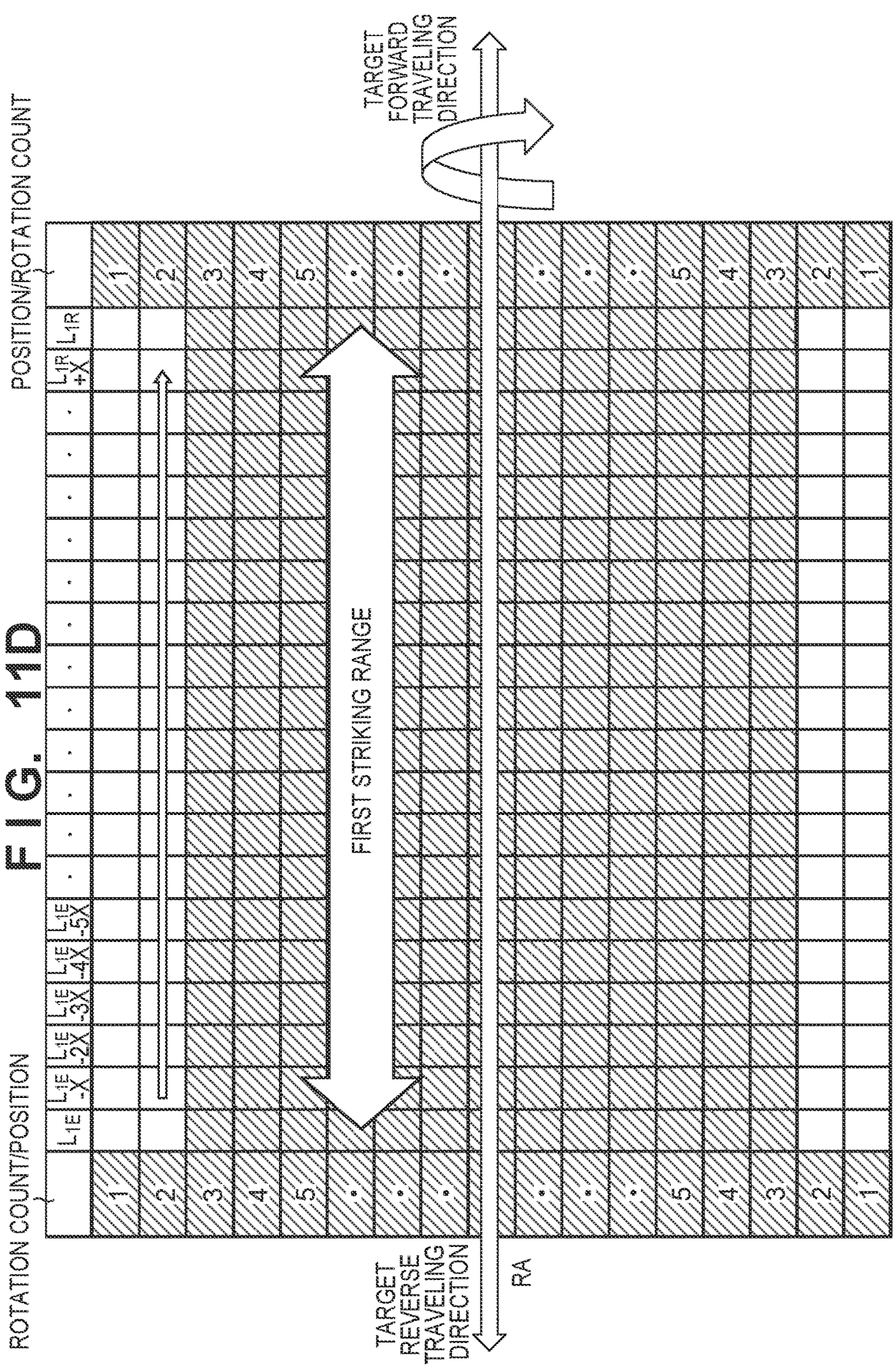

As described above, after the changing step and the deposition step are performed within the (n–1)th striking range ($L_{(n-1)R}$–$L_{(n-1)E}$), the striking range is changed (reduced) from the (n–1)th striking range ($L_{(n-1)R}$–$L_{(n-1)E}$) to the nth striking range ($L_{nR}$–$L_{nE}$) shown in FIG. 10E. In this case, the striking range can be sequentially changed from the first striking range ($L_{1R}$mm–$L_{1E}$mm) to the nth striking range ($L_{nR}$mm–$L_{nE}$mm) (n is an integer). In addition, the striking range is given as $L > L_{1R} - L_{1E} > L_{2R} - L_{2E} > L_{3R} - L_{3E} > \ldots L_{(n-1)R} - L_{(n-1)E} > L_{nR} - L_{nE}$ with respect to the length Lmm of the target TG.

According to this embodiment, since the arc discharge can be stably generated regardless of the striking position by performing the changing step and the reduction step, uniform films can be continuously formed at a stable deposition rate. In addition, according to this embodiment, since the processing of trimming the target TG by a processing machine such as a grinder is unnecessary, the size reduction of the apparatus and the reduction of the maintenance cost can be implemented.

In addition, according to this embodiment, after the target TG is rotated by two rotations about the rotation axis RA at each of the two ends of the striking range in the forward/reverse traveling direction of the target TG, the target TG can be moved in the forward/reverse traveling direction. In addition, after the target TG is rotated by one rotation about the rotation axis RA at a position except the two ends of the striking range in the forward/reverse traveling direction of the target TG, the target TG can be moved in the forward/reverse traveling direction. However, the number of rotations of the target TG as the condition of changing the striking position in the forward/reverse traveling direction may be equal to each other in all areas of the striking ranges. Alternatively, the number of rotations of the target TG may be appropriately changed within the stable arc discharge generation range between the two ends of the striking range and the position except for the two ends. For example, the number of rotations of the target TG as the condition for changing the striking position in the forward/reverse traveling direction, that is, rotation count preferably falls within one to four rotations.

In addition, according to this embodiment, the pivotal and moving operations of the target TG are controlled so that the target TG is moved in the forward/reverse traveling direction after the target TG is pivoted about the rotation axis RA. However, the present invention is not limited to this control. For example, the pivotal and moving operations of the target TG may be controlled such that the defective portion CP is formed in a helical shape, that is, the locus of the arc spots on the opposing outer circumferential surface $TG_O$ of the target TG forms a helical shape.

In the above example, the striking position is changed every time the arc discharge is generated. However, the striking position may be changed every time the size of the defective portion formed by the arc spot becomes larger than a predetermined size. In other words, the spike position is not changed until the size of the defective portion formed by the arc spot on the target TG becomes larger than the predetermined size.

The deposition rate of a film to be formed on the substrate 1 can be changed in accordance with the position of an arc spot formed by the arc discharge. More specifically, if the arc spot is present at the center of the anode 316, the deposition increases. If the arc spot comes close to the anode 316, the deposition rate decreases. For this reason, the arc spot is preferably formed at a position away from the anode 316. Accordingly, in this embodiment, the striker driving unit 326 drives the target TG such that the positional relationship between the anode 316 and the discharge portion 320a of the striker 320 in the contact state is kept constant. Therefore, the deposition rate can be stabilized.

An example of a deposition method of forming a ta-C film by the deposition apparatus 300 of the vacuum processing apparatus VP will be described below. An adhesion layer, a lower soft magnetic layer, a seed layer, an intermediate layer, and a magnetic recording layer were formed on the substrate in this order by using the apparatus shown in the above embodiment. Next, a ta-C film was formed as a surface protective layer on the substrate on which the magnetic recording layer was formed.

Example 1

FIGS. 11A to 13D are views showing an example of target driving control according to Example 1. In each view, the number of rotations (the number of 360° rotations) of a target TG about a rotation axis RA at each striking position of the target TG is described. FIGS. 11A to 11D show driving control of the target in the first striking range ($L_{1R}$mm–$L_{1E}$mm). Driving of the target TG is started from a striking position SP (the forward/reverse traveling position $L_{1R}$ and pivot angle=0). The target TG is rotated by two rotations (FIG. 11A) about the rotation axis RA at a striking position=$L_{1R}$ in the forward/reverse traveling direction of the target TG. After that, the target TG is moved by Xmm in the forward traveling direction to change the striking position. The target TG is then rotated by one rotation about the rotation axis RA at a position $L_{1R}$+X of the target TG in the forward/reverse traveling direction. After that, the target TG is moved by Xmm in the forward traveling direction to change the striking position. This operation is repeated until the striking position reaches a second end $L_{1E}$ of the first striking range (FIG. 11B). Next, the target TG is further rotated by one rotation (FIG. 11C) about the rotation axis RA at the second end $L_{1E}$ of the first striking range, and the target TG is moved by Xmm in the reverse traveling direction. The target TG is rotated by one rotation about the rotation axis RA at a position $L_{1E}$–X of the target TG in the forward/reverse traveling direction, and then the target TG is moved by Xmm in the reverse traveling direction. This operation is repeated from the position $L_{1E}$–X of the target in the forward/reverse traveling direction to $L_{1R}$+X. The target TG is moved to $L_{1R}$+X of the first striking range (FIG. 11D). These pivotal operations and the forward and reverse traveling operations of the target TG are repeated until each striking position of the target TG in the forward/reverse traveling direction is passed twice.

Figure 12A:
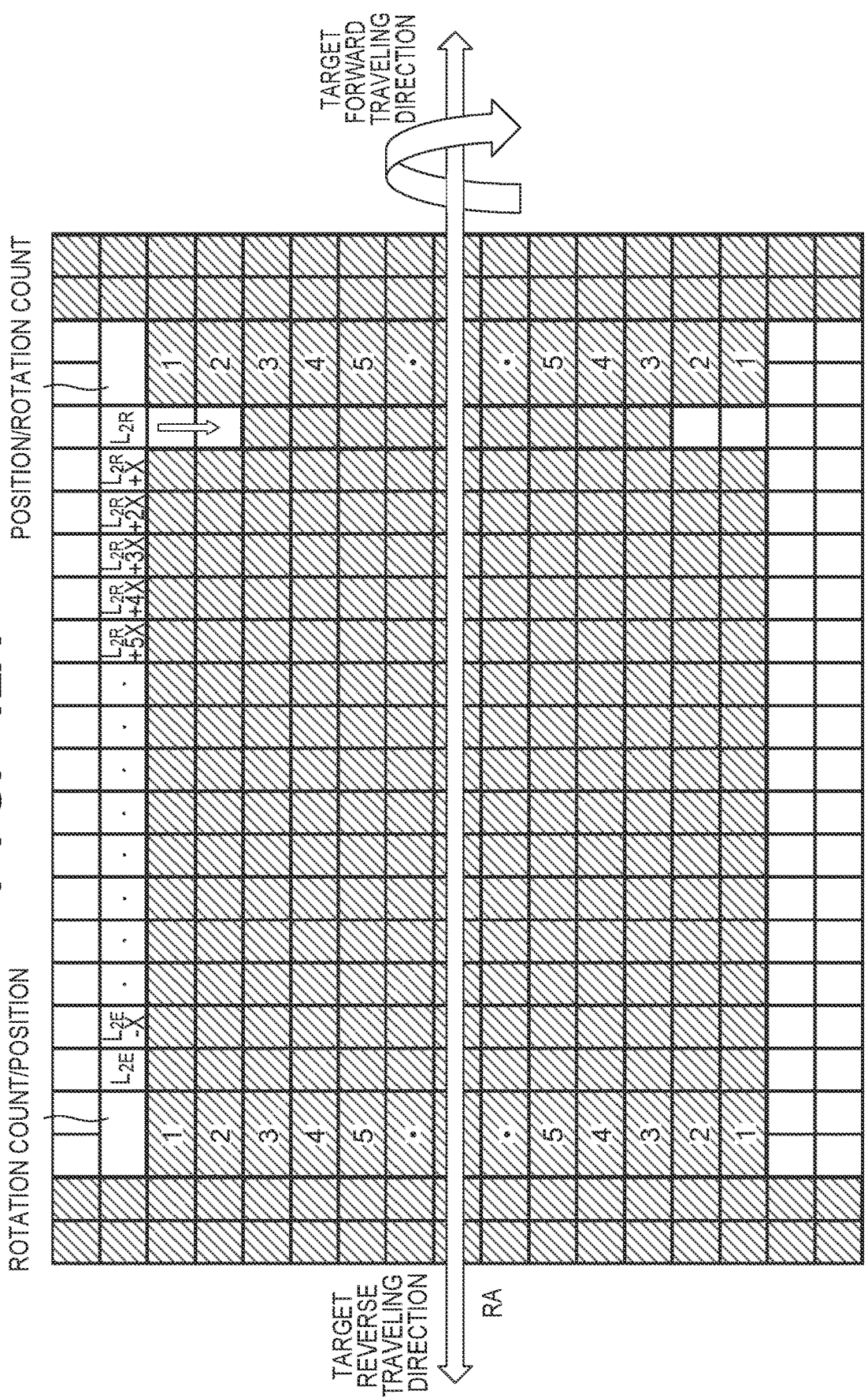
Figure 12B:
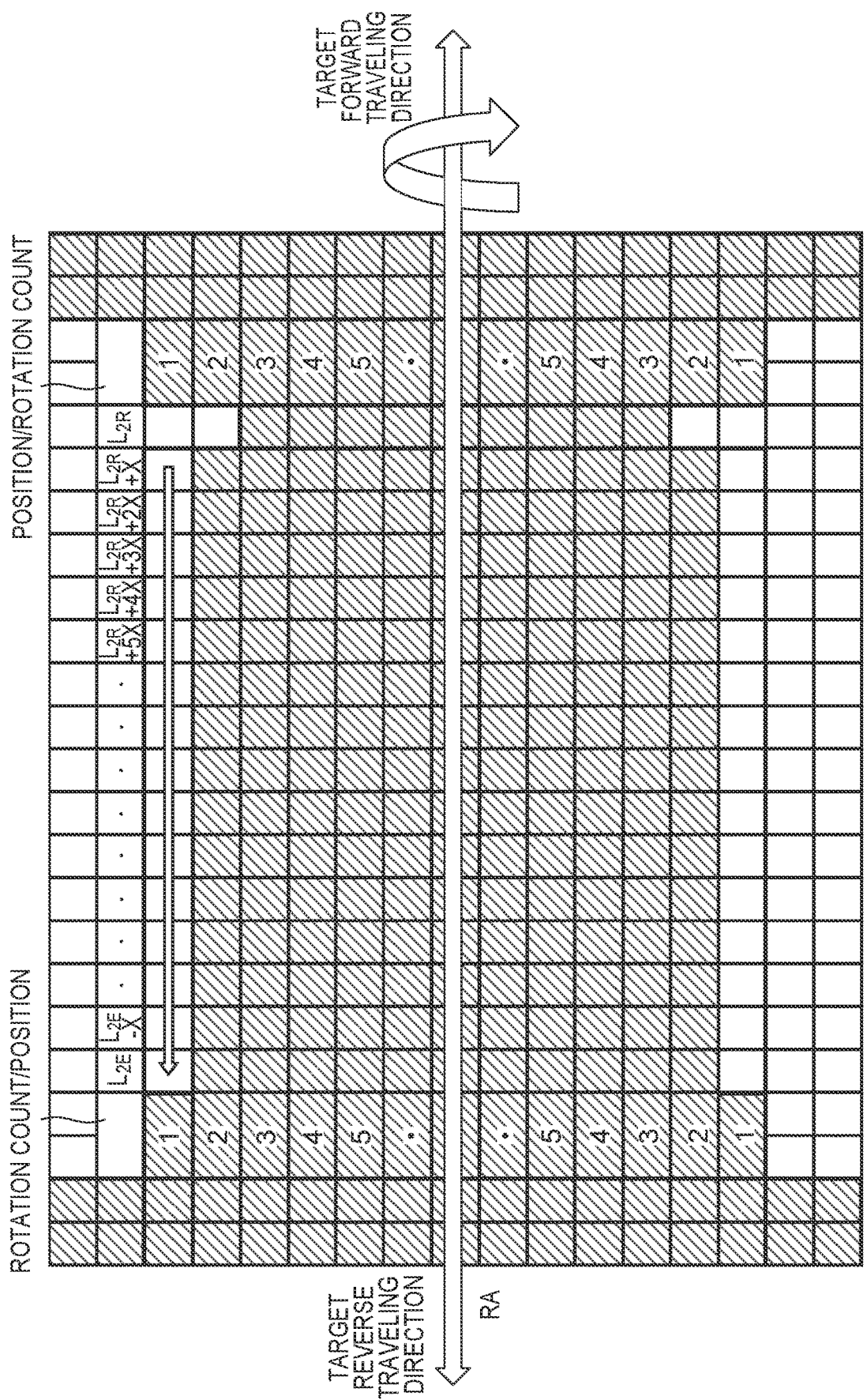
Figure 12C:
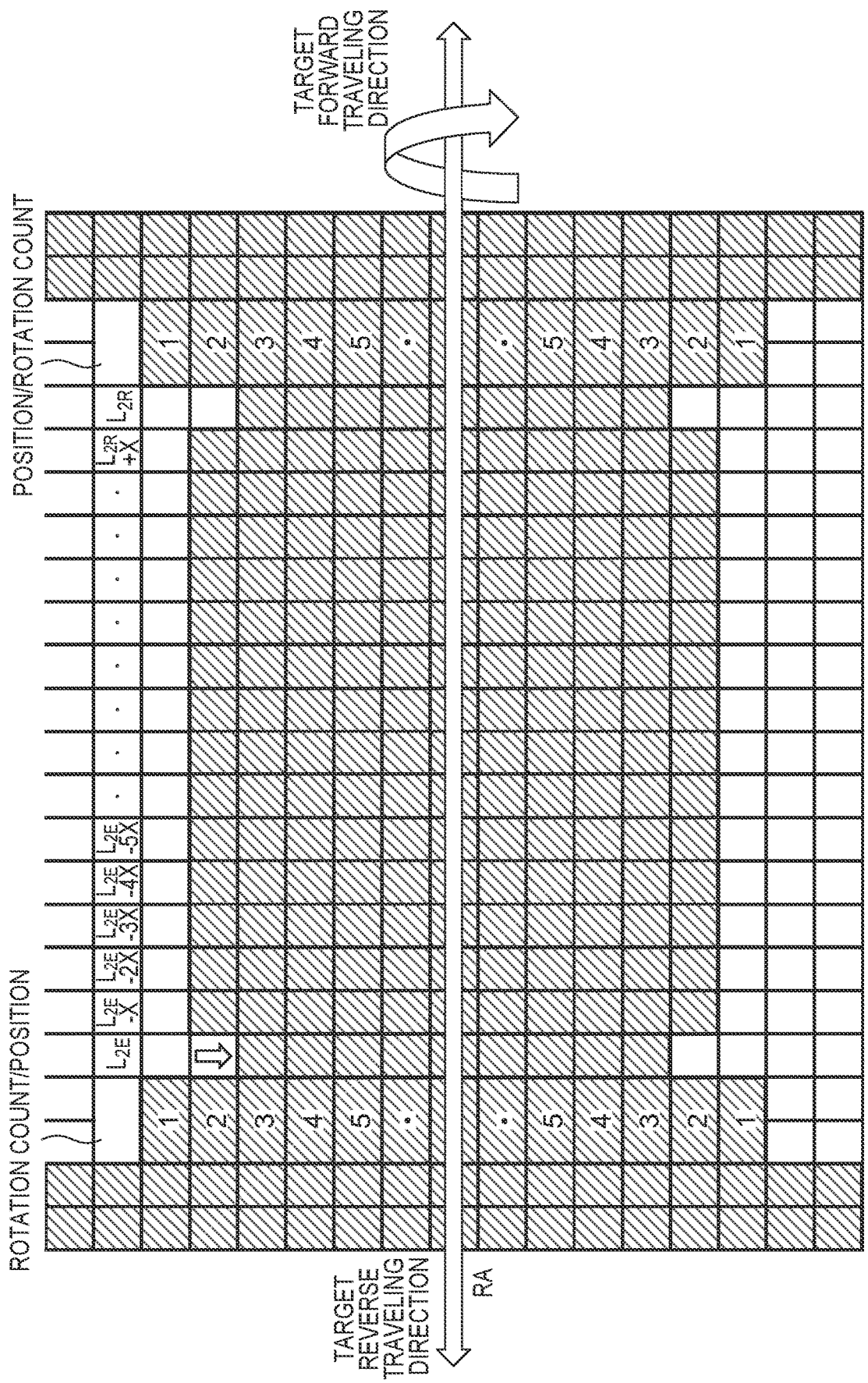
Figure 13A:
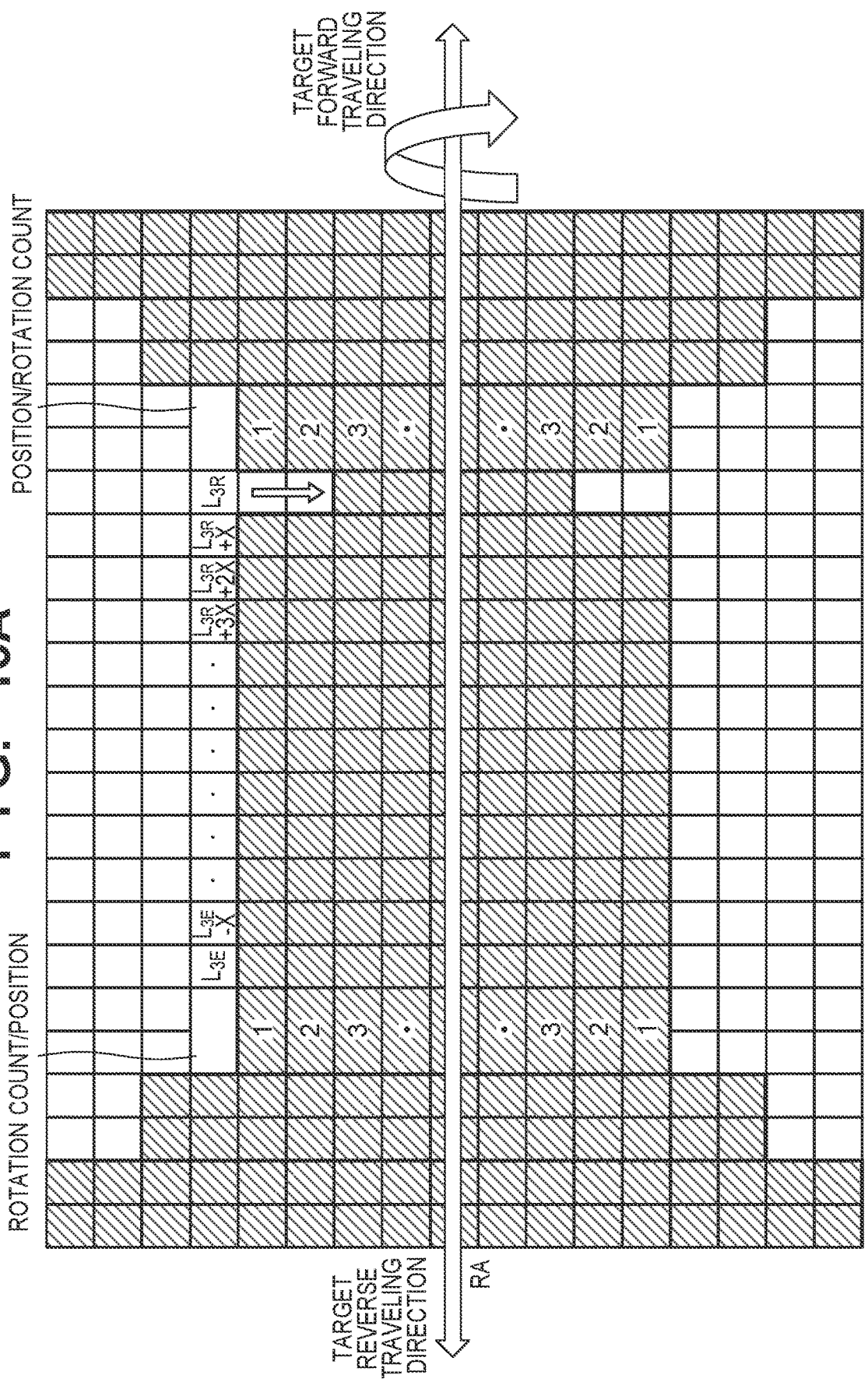

FIGS. 12A to 12D shows driving control of the target TG in a second striking range ($L_{2R}$–$L_{2E}$). In this example, a first end $L_{2R}$ of the second striking range is $L_{1R}$+2X, and a second end $L_{2E}$ of the second striking range is $L_{1E}$–2X. The target TG is rotated by two rotations (FIG. 12A) about the rotation axis RA at the striking position=$L_{2R}$ of the target TG in the forward/reverse traveling direction. After that, the target TG is moved by Xmm in the forward traveling direction to change the striking position. The target TG is then rotated by one rotation about the rotation axis RA at a position $L_{2R}$+X of the target TG in the forward/reverse traveling direction. After that, the target TG is moved by Xmm in the forward traveling direction to change the striking position. This operation is repeated until the striking position reaches a second end $L_{2E}$ of the second striking range (FIG. 12B). Next, the target TG is further rotated by one rotation (FIG. 12C) about the rotation axis RA at the second end $L_{2E}$ of the second striking range, and the target TG is moved by Xmm in the reverse traveling direction. The target TG is rotated by one rotation about the rotation axis RA at a position $L_{2E}$–X of the target TG in the forward/reverse traveling direction, and then the target TG is moved by Xmm in the reverse traveling direction. This operation is repeated from the position $L_{2E}$–X of the target in the forward/reverse traveling direction to $L_{2R}$+X. The target TG is moved to $L_{2R}$+X of the second striking range (FIG. 12D). These pivotal operations and the forward and reverse traveling operations of the target TG are repeated until each striking position of the target TG in the forward/reverse traveling direction is passed twice.

Even in the second striking range, as in the first striking range, the target TG is rotated by two rotations about the rotation axis RA at the position of each of the two ends of the striking range, and then the target TG is moved in the forward/reverse traveling direction. At the forward/reverse traveling position of the target TG except the positions of the two ends, the target TG is rotated by one rotation about the rotation axis RA, and then the target TG is moved in the forward/reverse traveling direction. This operation is repeated until each striking position of the target in the forward/reverse traveling direction is passed twice. As in the change from the first striking range to the second striking range, the striking range is changed to a third striking range ($L_{3R}$–$L_{3E}$).

FIGS. 13A to 13D show driving control of the target TG in the third striking range ($L_{3R}$–$L_{3E}$). In this example, a first end $L_{3R}$ of the third striking range is $L_{2R}$+2X, and a second end $L_{3E}$ of the second striking range is $L_{2E}$–2X.

In each striking range as described above, the target TG is sequentially moved so that the striking range is narrowed by 2 Xmm on each side every time each position of the target TG in the forward/reverse traveling direction is passed twice, that is, the striking range is narrowed by 4 Xmm. The number of rotations of the target TG as the condition for changing the striking range is decided based on a change in deposition rate during, for example, one rotation of the target TG. In this example, the striking range is changed every time each position of the target TG in the forward/reverse traveling direction is passed twice. However, the present invention is not limited to this. The striking range may be changed within a range in which arc discharge is stably generated. In addition, the passing count can be individually set every striking range. Furthermore, in this embodiment, the striking range is narrowed every 2 Xmm on each side. However, the present invention is not limited to this.

Example 2

Next, Example 2 will be described below. The driving control of a target TG in each striking range is the same as in Example 1. However, in the determination to determine whether the striking range is changed, the pivot angle (FIG. 6) of a striker 320 when the discharge portion of the striker 320 is brought into contact with the target TG is used. The pivot angle of the striker 320 when a discharge portion 320a of the striker 320 is brought into contact with the target TG is referred to as a striker 320 contact pivot angle or simply a contact pivot angle. The contact pivot angle indicates a change amount of the current position of an outer circumferential surface $TG_0$ of the target TG from the outer circumferential surface $TG_0$ of the target TG, that is, the position of the unused outer circumferential surface $TG_0$ of the target TG. In Example 1, when changing the striking range, the change in striking range is determined by the passing count (the number of rotations) of each striking position of the target TG in the forward/reverse traveling direction. On the other hand, in this example, the erosion of the target TG (hereinafter referred as "target erosion") is estimated from the pivot angle between the target TG and the striker 320, thereby changing the striking range.

In this example, the contact pivot angle of the striker 320 is measured for each striking operation. The target erosion is determined in accordance with a change in contact pivot angle of the striker 320, thereby changing the striking range. That is, the target erosion (the target shape) can be monitored in real time in accordance with a difference between the contact pivot angle for each striking operation and the contact pivot angle of the striker 320 which is obtained when the discharge portion 320 of the striker 320 is brought into contact with the unused target TG. According to this example, the target TG can be efficiently used regardless of deposition conditions.

The measurement of the contact pivot angle of the striker 320, which is performed to determine whether the striking range is changed can be done at a position (that is, a position in the striking range) sufficiently spaced apart from the boundary between the striking range and the non-striking range. This is because there exists the step at the boundary between the striking range and the non-striking range and the variations in the pivot angle of the striker 320 increase due to this step. For example, an average value of the contact pivot angles measured at a plurality of striking positions can be used as the contact pivot angle of the striker 320 which is used for the determination. As an example of determination, after the contact pivot angle measured for the target immediately after the use is increased by 1.0° as compared with the contact pivot angle measured for the unused target, the range is reduced from the first striking range to the second striking range. Similarly, after the contact pivot angle measured for the target immediately after the use is increased by 2.0° as compared with the contact pivot angle measured for the unused target, the range is reduced from the second striking range to the third striking range. In this example, the target is driven so that the striking range is reduced every time the contact pivot angle of the striker is increased by 1.0°.

Driving of the target TG is performed in the same manner as in Example 1. That is, after the target TG is rotated by two rotations about a rotation axis RA at the position of each of the two ends of the striking range, the target TG is moved in the forward/reverse traveling direction. At a position of the target TG in the forward/reverse traveling direction except the position of each of the two ends, the target TG is rotated by one rotation about the rotation axis RA, and then the target TG is moved in the forward/reverse traveling direction.

As described above, the striking range is reduced stepwise so that the striking range is narrowed every 2X on each side, that is, the striking range is narrowed every 4X in accordance with the pivot angle of the striker. For example, the contact pivot angle of the striker 320 as the condition for reducing the striking range is decided based on the deposition rate change or arc discharge stability data with respect to the contact pivot angle of the striker 320. In this example, the striking range is changed every time the contact pivot angle of the striker 320 increases by 1.0°. However, the present invention is not limited to this. The striking range may be changed within a range in which arc discharge is stably generated. In addition, the contact pivot angle (the change amount from the pivot angle of the striker 320 which is measured for the unused target TG of the striker 320) for each striking range can be individually set. In addition, in this example, the striking range is reduced every 2 Xmm on each side. However, the present invention is not limited to this.

Example 3

As Example 3, whether the striking range is changed is determined based on a plasma amount to be transported. In this example, the same effect as in Examples 1 and 2 can be obtained. The plasma amount to be transported can be evaluated based on an integral value of currents flowing into a transport unit 304. The plasma amount has a correlation with the thickness of a film to be formed on a substrate. The deposition rate increases with a larger plasma amount per unit time. In addition, the driving control of a target TG in each striking range is the same as in Examples 1 and 2.

In this example, current values flowing into the transport unit 304 are measured and integrated in a state in which a positive bias voltage is applied to the transport unit 304, thereby determining the target erosion and changing the striking range. In this case, the current value flowing into the transport unit 304 is equivalent to the plasma amount. That is, the integrated current value immediately after the start of use of the unused target or immediately after the change in striking range is compared with the integrated current value when the striker reaches the two end portions of the striking range of the target TG in the forward/reverse traveling direction. This makes it possible to monitor, in real time, the decrease in deposition rate caused by the step formed at the boundary between the striking range and the non-striking range. As in Example 2, the target TG can be efficiently used depending on the deposition conditions. For example, after a ratio of the integrated current value at an end of the striking range to the integrated current value immediately after the start of use of the unused target or immediately after the change in striking range becomes 0.85 or less, the striking range is changed from the first striking range to the second striking range and from the second striking range to the third striking range.

The target is moved so that the striking range is reduced every 2 Xmm on each side, that is, the striking range is reduced every 4 Xmm in accordance with the integrated current value immediately after the start of use of the unused target or immediately after the change in striking range as described above and the integrated current value at the end of the striking range of the target TG in the forward/reverse traveling direction. According to this example, since the plasma amount to be transported by the transport unit 304 can be monitored in real time, the striking range can be changed every time the plasma amount transported by the transport unit 304 is reduced by the step formed by the striking range and the non-striking range without obtaining data beforehand as in Examples 1 and 2. In this example, after the ratio becomes 0.85 or less, the striking range is changed. However, the present invention is not limited to this. The striking range may be changed within a range in which the arc discharge is stably generated. In addition, the ratio can be individually set. Furthermore, in this example, the striking range is reduced every 2 Xmm on each side. However, the present invention is not limited to this.

The present invention has been described with reference to the preferred embodiments. However, the present invention is not limited to these embodiments. Various changed and modification can be made within the spirit and scope of the present invention.

REFERENCE SIGNS LIST

1: substrate, 10: carrier, 129: processing chamber, 304: transport unit, 310: ion generation unit, 312: target driving unit, 316: anode, 318: target holder, 320: striker, 320a: discharge portion, 322: rotation unit, 324: moving unit, 326: striker driving unit, 801: host control device, 802: control unit, 803: power applying unit, TG: target, $TG_0$: outer circumferential surface of target, RA: rotation axis, FCL: filter coil, ACL: stabilizing coil, SCL: scanning magnetic field generation unit

The invention claimed is:

1. A deposition method of arranging a discharge portion of a striker near a target to induce arc discharge and forming a film on a substrate using a plasma generated by the arc discharge, the method comprising:
   a changing step of changing a position for inducing the arc discharge by the striker in a striking range of the target, the striking range being situated between two distal ends of the target;
   a deposition step of forming the film on the substrate using the plasma generated by inducing the arc discharge at the position within the striking range of the target; and
   a reduction step of reducing the striking range of the target in accordance with use of the target,
   wherein after a cycle including the changing step and at least one deposition step is repeated a plurality of times, the reduction step is performed, and then the cycle is repeated, and
   wherein in the reduction step, the striking range of the target is reduced along a dimension of the striking range so that the striking range of the target after the reduction falls within the striking range of the target before the reduction.

2. The deposition method according to claim 1, wherein in the changing step, the position is changed by pivoting the target.

3. The deposition method according to claim 2, wherein the target is fixed to a target holder, and in the changing step, the position is further changed by moving the target holder in a direction parallel to a rotation axis of the target.

4. The deposition method according to claim 3, wherein in the reduction step, the striking range of the target is reduced with respect to the direction.

5. The deposition method according to claim 3, wherein in the changing step, a position of the target in the direction is changed in accordance with the number of rotations of the target which has been caused by pivoting the target a plurality of times in a state in which the position of the target in the direction is fixed.

6. The deposition method according to claim 3, wherein in the changing step, a position of the target in the direction is changed in accordance with a pivot angle of the striker when the discharge portion is brought into contact with the target.

7. The deposition method according to claim 3, wherein in the changing step, a position of the target in the direction is changed in accordance with a plasma amount to be transported from a plasma generation unit including the target to a processing chamber in which the substrate is arranged.

8. The deposition method according to claim 1, wherein the striker engages with an outer circumferential surface of the target.

9. A deposition apparatus for arranging a discharge portion of a striker near a target to induce arc discharge and forming a film on a substrate using a plasma generated by the arc discharge, the apparatus comprising:
   a changing mechanism configured to change a position of the target for inducing the arc discharge by the striker; and
   a control unit configured to control the changing mechanism so that the position of the target is changed in a striking range of the target, the striking range being situated between two distal ends of the target,
   wherein the control unit is further configured to reduce the striking range of the target along a dimension of the striking range stepwise in accordance with use of the target so that the striking range of the target after the reduction falls within the striking range of the target before the reduction.

10. The deposition apparatus according to claim 9, wherein the striker engages with an outer circumferential surface of the target.

11. A deposition method of arranging a discharge portion of a striker near a target to induce arc discharge and forming a film using a plasma generated by the arc discharge, the method comprising:
   a deposition step of forming a film on a substrate using the plasma generated by inducing the arc discharge at a position within a striking range of the target, the striking range being situated between two distal ends of the target;
   a changing step of changing a position for inducing the arc discharge by the striker within the striking range of the target;
   a deposition step of forming a film on a substrate using the plasma generated by inducing the arc discharge at the changed position within the striking range of the target;
   a reduction step of reducing the striking range of the target between the two ends of the target;
   a changing step of changing the position for inducing the arc discharge by the striker within the changed striking range of the target;
   a deposition step of forming a film on a substrate using the plasma generated by inducing the arc discharge at the changed position within the changed striking range of the target.

12. The deposition method according to claim 11, wherein the striker engages with an outer circumferential surface of the target.

* * * * *